(12) United States Patent
Sakamoto et al.

(10) Patent No.: US 8,188,378 B2
(45) Date of Patent: *May 29, 2012

(54) INTERPOSER AND METHOD FOR MANUFACTURING INTERPOSER

(75) Inventors: Hajime Sakamoto, Ogaki (JP); Shuichi Kawano, Ogaki (JP); Daiki Komatsu, Ogaki (JP); Toshiki Furutani, Ogaki (JP); Hiroshi Segawa, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 682 days.

This patent is subject to a terminal disclaimer.

(21) Appl. No.: 12/345,349

(22) Filed: Dec. 29, 2008

(65) Prior Publication Data

US 2009/0173522 A1 Jul. 9, 2009

Related U.S. Application Data

(60) Provisional application No. 61/038,939, filed on Mar. 24, 2008, provisional application No. 61/017,413, filed on Dec. 28, 2007.

(51) Int. Cl.
*H05K 1/11* (2006.01)

(52) U.S. Cl. ........................................ 174/262; 174/260

(58) Field of Classification Search .................. None
See application file for complete search history.

(56) References Cited

U.S. PATENT DOCUMENTS

| 5,252,519 A * | 10/1993 | Nakatani et al. ................. 29/832 |
| 5,500,278 A | 3/1996 | Nagasaka |
| 7,652,213 B2 * | 1/2010 | Yamamoto et al. ........... 174/262 |
| 7,847,197 B2 * | 12/2010 | Oikawa et al. ................. 174/262 |
| 2006/0185141 A1 * | 8/2006 | Mori et al. .................... 29/25.41 |

FOREIGN PATENT DOCUMENTS

| JP | 5-21635 | 1/1993 |
| JP | 2006-019433 | 1/2006 |

* cited by examiner

*Primary Examiner* — Ishwarbhai Patel
(74) *Attorney, Agent, or Firm* — Oblon, Spivak, McClelland, Maier & Neustadt, L.L.P.

(57) ABSTRACT

An interposer having a support substrate, a first insulation layer made of an inorganic material and formed over the support substrate, and a second insulation layer formed over the first insulation layer. The first insulation layer has a first land, a second land and a first wiring electrically connecting the first land and the second land. The second insulation layer has a first pad positioned to load a first electronic component, a second pad positioned to load a second electronic component, a second wiring electrically connected to the second pad, a first via conductor electrically connecting the first land and the first pad, and a second via conductor electrically connecting the second land and the second wiring. The first wiring and second wiring electrically connect the first pad and the second pad, and the second wiring has a lower wiring resistance per unit length than the first wiring.

17 Claims, 20 Drawing Sheets

INTERPOSER AND METHOD FOR MANUFACTURING INTERPOSER

CROSS-REFERENCE TO RELATED APPLICATIONS

The present application claims the benefits of priority to U.S. Applications No. 61/017,413, filed Dec. 28, 2007, and 61/038,939, filed Mar. 24, 2008. The contents of those applications are incorporated herein by reference in their entirety.

BACKGROUND OF THE INVENTION

1. Field of the Invention

The present invention is related to an interposer and a method of manufacturing an interposer.

2. Discussion of the Background

For an intermediate substrate on which multiple electronic components such as logic or memory are loaded, a substrate called an interposer is used. Electronic components loaded on an interposer have been highly integrated recently and to pull numerous wiring lines from the electronic components, surface mounting methods such as a BGA are used. In an interposer on which to load such electronic components, wiring is required to be pulled from a section connected to an electronic component toward the wiring connected to another electronic component. Therefore, numerous wiring distributions are arranged inside an interposer.

Also, the amount of data that electronic components handle is increasing. Accordingly, it is required that large-volume signal transmission and high-speed signal transmission be carried out in an interposer. To conduct large-volume signal transmission and high-speed signal transmission, the wiring resistance of the wiring between one electronic component and other electronic components is required to be low.

Japanese Laid-Open Patent Application 2006-19433 describes a type of interposer in which wiring is formed in each of the laminated multilayer organic insulation layers and on which to load electronic components. On the other hand, there is also a type of interposer in which wiring to load electronic components is formed on inorganic insulation layers by wiring-forming methods such as a damascene method used in semiconductor manufacturing steps. The contents of this publication are incorporated herein by reference in their entirety.

SUMMARY OF THE INVENTION

According to one aspect of the present invention, an interposer has a support substrate, a first insulation layer made of an inorganic material and formed over the support substrate, and a second insulation layer formed over the first insulation layer. The first insulation layer has a first land, a second land and a first wiring electrically connecting the first land and the second land. The second insulation layer has a first pad positioned to load a first electronic component, a second pad positioned to load a second electronic component, a second wiring electrically connected to the second pad, a first via conductor electrically connecting the first land and the first pad, and a second via conductor electrically connecting the second land and the second wiring. The first wiring and second wiring electrically connect the first pad and the second pad, and the second wiring has a lower wiring resistance per unit length than the first wiring.

According to another aspect of the present invention, a method of manufacturing an interposer includes providing a support substrate, forming a first insulation layer comprising an inorganic material over the support substrate, forming a first land, a second land and a first wiring electrically connecting the first land and the second land in or on the first insulating layer, forming a second insulation layer over the first insulation layer and the first wiring, and forming in or on the second insulation layer a first pad positioned to load a first electronic component, a second pad positioned to load a second electronic component, a second wiring electrically connected to the second pad, a first via conductor electrically connecting the first land and the first pad, and a second via conductor electrically connecting the second land and the second wiring. The first wiring and second wiring electrically connect the first pad and the second pad, and the second wiring is formed a longer wiring length and a greater thickness than the first wiring.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
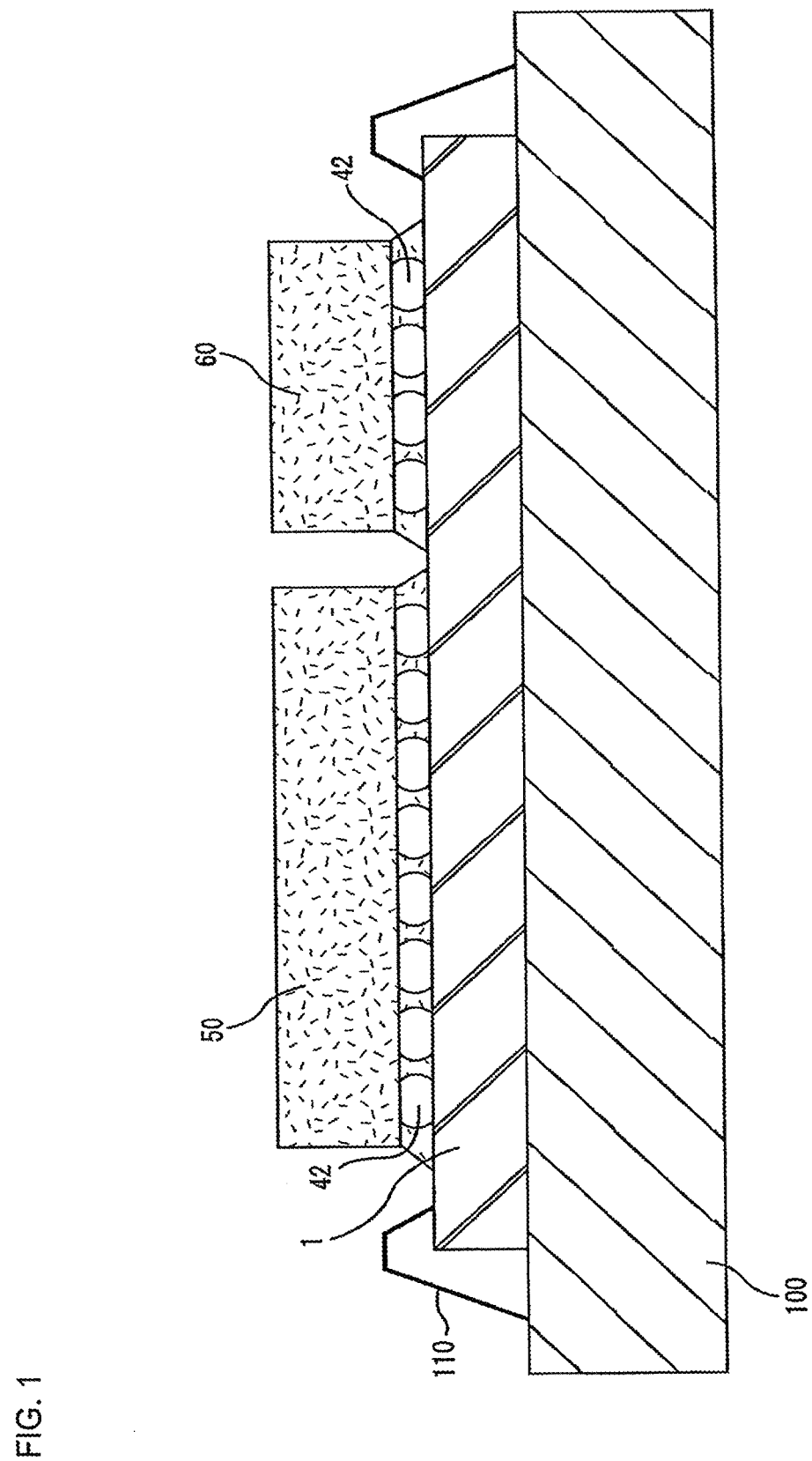
FIG. 1 schematically illustrates a cross-sectional view showing an application of an interposer according to an embodiment of the present invention.

The embodiments will now be described with reference to the accompanying drawings, wherein like reference numerals designate corresponding or identical elements throughout the various drawings.

FIG. 1 is a cross-sectional view schematically illustrating an example of how an interposer according to an embodiment of the present invention is used. Interposer 1 of this embodiment is positioned between first electronic component 50, second electronic component 60 (each electronic component includes semiconductor elements such as logic and/or memory) and printed wiring board 100. The interposer has wiring which connects multiple electronic components with each other. Electronic component 50 and electronic component 60 and interposer 1 are connected, for example, through bumps 42. Interposer 1 and printed wiring board 100 are connected, for example, through wire 110. However, connection methods between various components are not limited to the above.

First Embodiment

Figure 2:
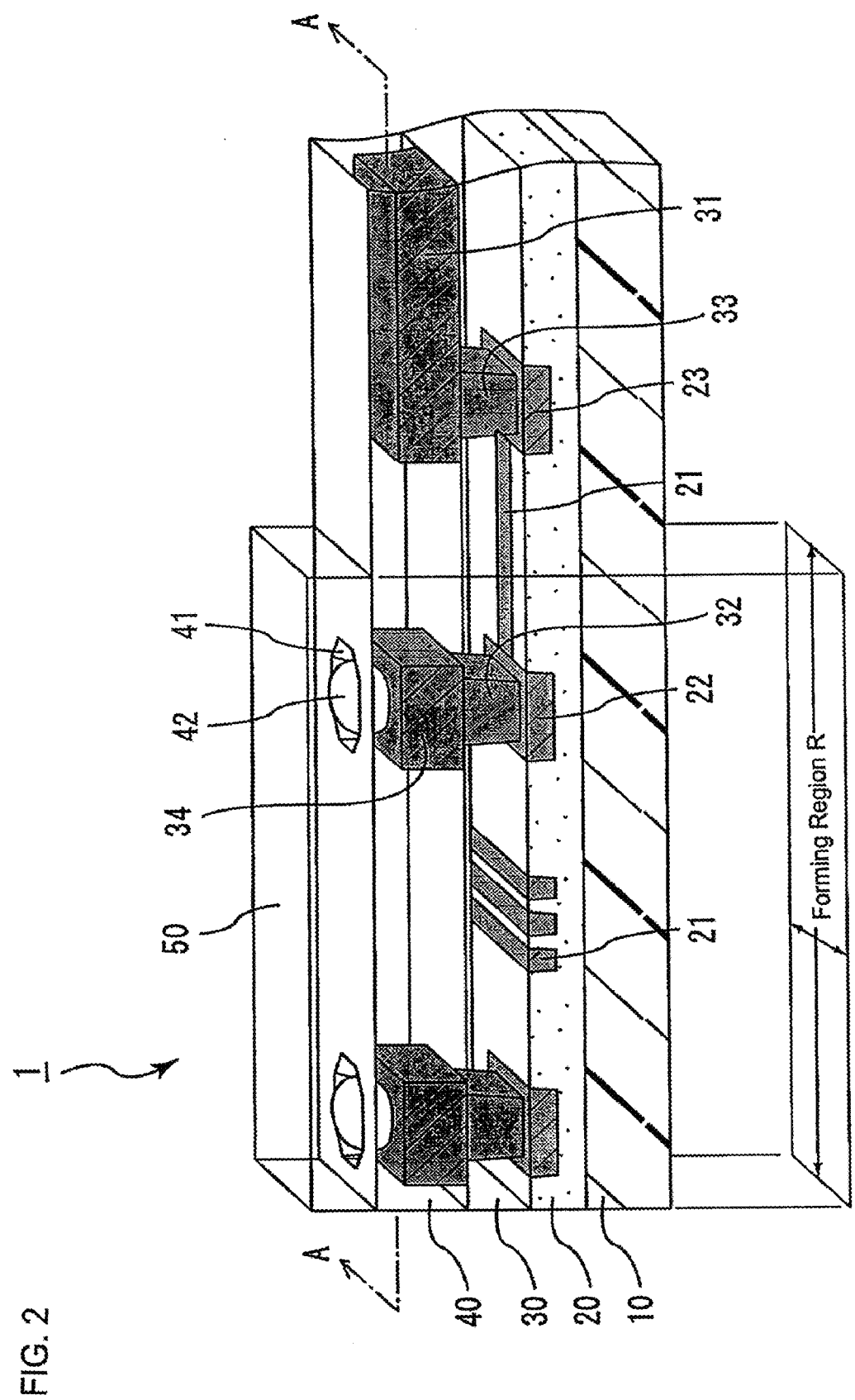
FIG. 2 schematically illustrates a perspective cross-sectional view partially showing an interposer according to an embodiment of the present invention.

FIG. 2 is a perspective cross-sectional view schematically illustrating part of an interposer according to an embodiment of the present invention. FIG. 2 omits the region positioned further right of the region shown in FIG. 2, which is the side where the second electronic component is loaded, and illustrates only the region which is the side where the first electronic component is loaded. Also, in FIG. 2, to show the interiors of the second insulation layer and the protective film, a perspective state in which the second insulation layer and the protective film are seen through is illustrated schematically. Also, to show a positional relationship between the first electronic component, bumps and first pads, a perspective state in which the sealing resin of the first electronic component is seen through is schematically illustrated.

Figure 3:
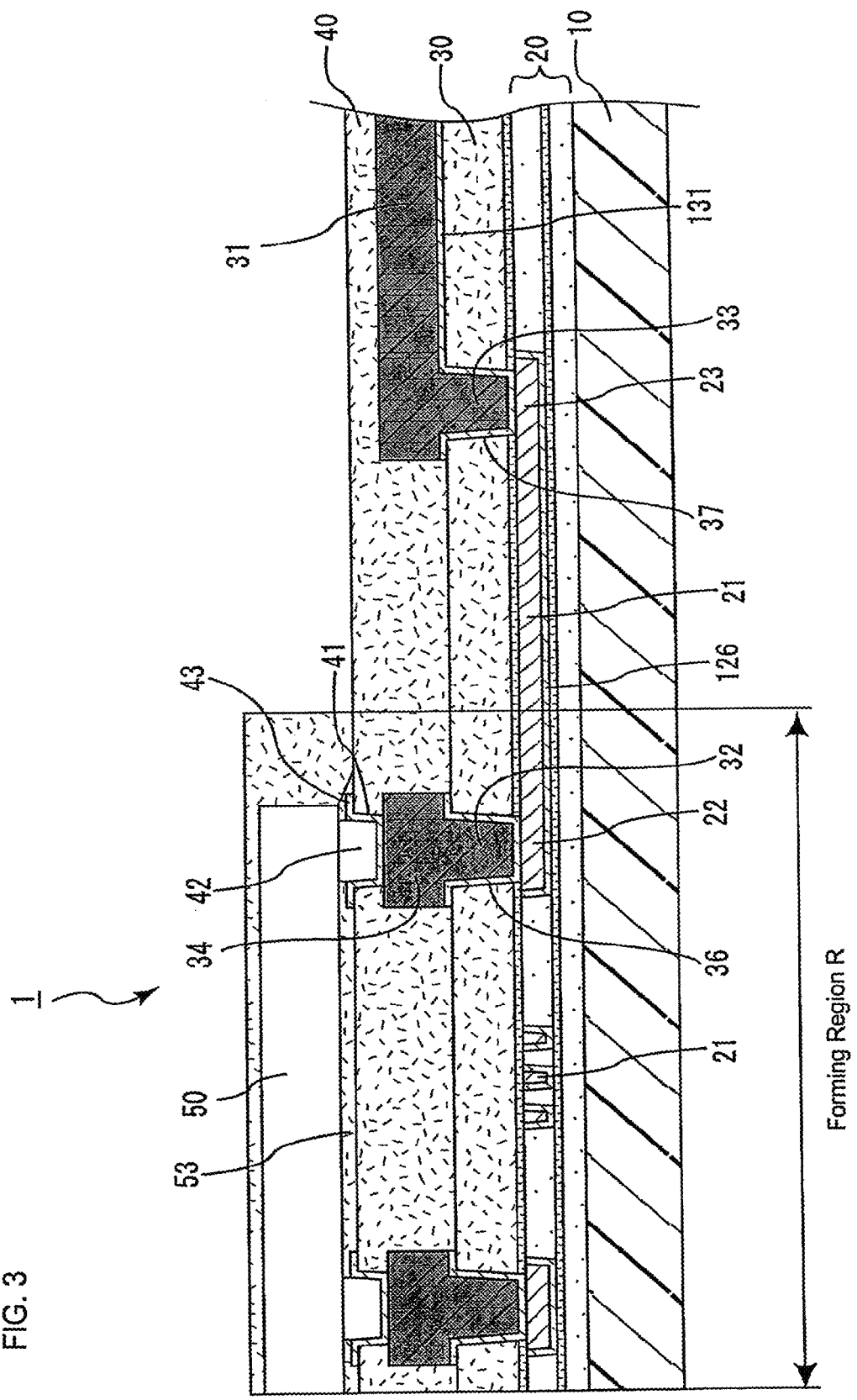
FIG. 3 illustrates a cross-sectional view taken at the A-A line of the interposer shown in FIG. 2.

FIG. 3 is a cross-sectional view of the interposer shown in FIG. 2 taken at the A-A line. A vertical cross-sectional view is shown to include the first wiring and second wiring.

Interposer 1 of this embodiment has support substrate 10, first insulation layer 20 made of inorganic material, first wiring 21 formed inside insulation layer 20, second insulation layer 30 made of organic material and second wiring 31 formed on second insulation layer 30. Incidentally, FIGS. 2 and 3 show a situation in which first electronic component 50 is loaded. In the following, the detailed description of each section is given one by one from the lower section with reference to FIGS. 2 and 3.

First, support substrate 10 is described. As for the material to form support substrate 10 in this embodiment, silicon, silicon nitride, silicon carbide, aluminum nitride and mullite may be listed. Among those, from a viewpoint that the degree of flatness on the surface is high and that fine wiring can be formed, silicon is preferred. Support substrate 10 is not limited to a specific thickness, but a range of 30-500 μm is preferred. If the thickness of support substrate 10 is less than 30 μm, the rigidity of the interposer may not be ensured. On the other hand, if the thickness of support substrate 10 exceeds 500 μm, it is not preferred, since the thickness of the entire interposer increases.

Next, the first insulation layer and its surrounding structure are described. Inside first insulation layer 20, first lands 22, second lands 23 and first wiring 21 are formed. First insulation layer 20 in this embodiment is a layer made of inorganic material such as $SiO_2$ (silicon dioxide) or $Si_3N_4$ (silicon nitride). An example of the specific layer structure is described in the section regarding a method of manufacturing an interposer of the present embodiment.

First lands 22 are formed in first insulation layer 20 in such a way that the top surfaces of first lands 22 are exposed on the top surface of first insulation layer 20, and are positioned directly under first electronic component 50, namely in forming region (R) for first pads 34. Second lands 23 are formed in first insulation layer 20 in such a way that the top surfaces of second lands 23 are exposed on the top surface of first insulation layer 20, and are positioned outside forming region (R) for first pads 34. First wiring 21 is formed inside first insulation layer 20 and electrically connects first lands 22 and second lands 23. In addition, first lands 22, second lands 23 and first wiring 21 are structured with copper plating and seed layer 126 (see FIG. 3) under the copper plating. A structural example of the seed layer is described in the section regarding a method of manufacturing an interposer of the present embodiment.

In the present embodiment, first lands 22, second lands 23 and first wiring 21 are formed by a damascene method. The L/S of first wiring 21 is small compared with the later-described L/S of second wiring 31 (L/S=wire width/distance between adjacent wires). The first wiring is not limited to a specific L/S as long as it is within such a range as to allow a wiring distribution in the first-pad forming region. Although the L/S is preferred to be approximately 1 μm/1 μm, it may be finer than that. The thickness of first wiring 21 is smaller than the thickness of the later-described second wiring. First wiring 21 of the present embodiment is not limited to a specific thickness, but it is preferred to be 2 μm or less. If the thickness of first wiring 21 is 2 μm or less, finer wiring as well as easy processing is made possible, thus a lower cost is achieved.

In addition, since first lands 22, second lands 23 and first wiring 21 are formed by a damascene method, the surface having first insulation layer 20, first lands 22, second lands 23 and first wiring 21 is flat.

Also, in the present embodiment, the diameter of first lands 22 is larger than the diameter of later-described first via conductors 32, and the diameter of second lands 23 is larger than the diameter of later-described second via conductors 33. When comparing the diameter of lands and the diameter of via conductors, the diameters at the surfaces where lands and via conductors make contact with each other may be compared for that purpose.

Next, the second insulation layer and its surrounding structure are described. Second insulation layer 30 is made of organic material and is formed on first insulation layer 20. Inside second insulation layer 30, first via conductors 32 and second via conductors 33 are formed. Furthermore, on the surface of second insulation layer 30, first pads 34 and second wiring 31 and the second pads, which are not shown in the drawing, are formed.

Figure 10:
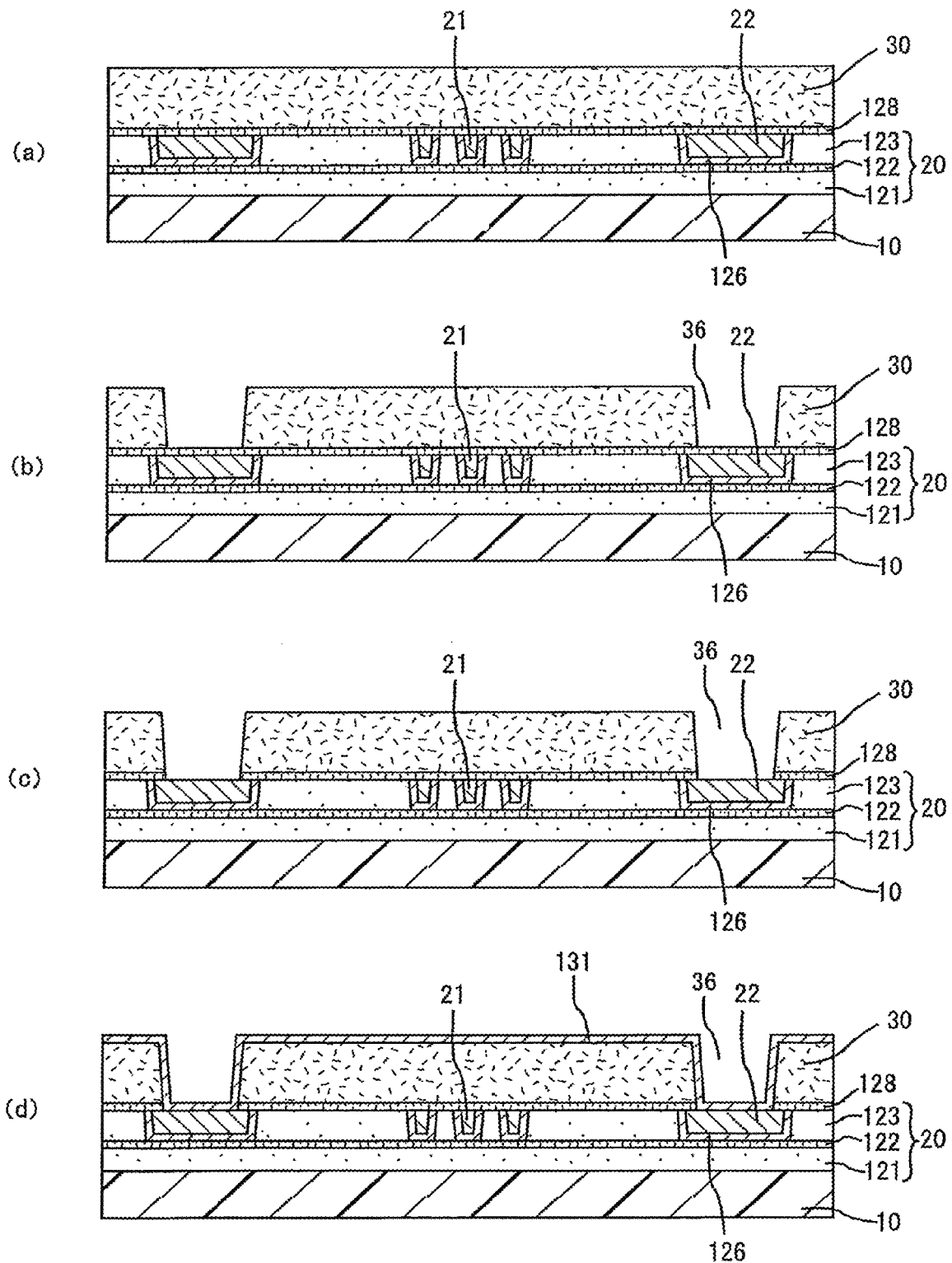
FIGS. 10(a), 10(b), 10(c) and 10(d) schematically illustrate cross-sectional views partially showing the steps of manufacturing an interposer according to the first embodiment.

Second insulation layer 30 is formed on first insulation layer 20, first lands 22, second lands 23 and first wiring 21, and has first opening portions 36 and second opening portions 37 (see FIG. 3 or FIG. 10(b)). In first opening portions 36, first via conductors 32 are formed, and in second opening portions 37, second via conductors 33 are formed. The bottom surfaces of first via conductors 32 are connected to first lands 22, and the bottom surfaces of second via conductors 33 are connected to second lands 23. Furthermore, on second insulation layer 30, first pads 34 are formed and first pads 34 are electrically connected to first via conductors 32. In addition, on second insulation layer 30, second wiring 31 is further formed, and second wiring 31 is electrically connected to second via conductors 33. Namely, first pads 34 and first lands 22 are connected through first via conductors 32, and second wiring 31 and second lands 23 are connected through second via conductors 33.

Second insulation layer 30 is a layer made of thermosetting resin, photosensitive resin, resin with a photosensitive group added to part of a thermosetting resin, thermoplastic resin or a resin composite including such resins. More specifically, photosensitive polyimide resin is preferred.

First via conductors 32, second via conductors 33, first pads 34 and second wiring 31 are structured with copper plating and seed layer 131 (see FIG. 3) beneath the copper plating. A structural example of the seed layer is described in the section regarding a method of manufacturing an interposer according to the present embodiment.

In the present embodiment, first via conductors 32, second via conductors 33, first pads 34 and second wiring 31 are formed by a semi-additive method. The L/S of second wiring 31 is large compared with the L/S of first wiring 21. In the present embodiment, the L/S of the second wiring is L/S=3 μm/3 μm; however, it is not limited to such. The L/S of the second wiring may be decided properly according to the number of second wiring lines and the area of the region where the second wiring is formed.

Second wiring 31 is thicker than first wiring 21. In the present embodiment, the thickness of second wiring 31 is not limited specifically; however, it is preferred to be made larger than 2 μm but no larger than 30 μm. If the thickness of second wiring 31 is within the above range, warping of the interposer is properly suppressed. Furthermore, it is possible to reduce the wiring resistance of second wiring 31. In addition, the thickness of the interposer will not increase. The thickness of the second wiring indicates an average value of each value obtained by measuring the thickness with a scanning electron microscope at the cross-sections of 10 points selected at random in a lengthwise direction. Regarding the thickness of the first wiring, it indicates the same as above. Also, the ratio of the thickness of the second wiring to the thickness of the first wiring is larger than one (1) but no larger than 15. If the ratio of the thickness of the second wiring to the thickness of the first wiring is less than one (1), the rigidity of the interposer is not sufficiently ensured and warping caused by the difference in thermal expansion coefficients between a semiconductor element and the interposer may occur in the interposer. On the other hand, if the ratio of the thickness of the second wiring to the thickness of the first wiring exceeds 15, assuming that the wiring width is the same, the aspect ratio of the second wiring increases. Accordingly, for example, when the organic layer expands/shrinks due to its thermal history, the second wiring would easily follow the expansion/shrinkage of the organic layer, and thus the adhesiveness of the second wiring to the organic layer may be lowered.

Also, not shown in FIGS. 2 and 3, the pitch of first via conductors 32 is formed to be smaller than the pitch of second via conductors 33.

Also, in FIGS. 2 and 3, the end to which second wiring 31 is connected is omitted from the drawing, but second wiring 31 is electrically connected to the second pads for connecting the second electronic component. An example of how the second wiring and second pads are connected is described later.

Next, protective film 40 is described. Protective film 40 is formed on the second insulation layer and second wiring. Protective film 40 has openings 41 to partially expose first pads 34 and the second pads respectively. Namely, as shown in FIG. 3, the outer peripheral portions of first pads 34 and the second pads are covered with protective film 40.

The material for protective film 40 is not limited specifically, but from the viewpoint of adhesiveness to the second insulation layer, organic material is preferred. Then, in openings 41, bumps 42 made of solder are formed via barrier metal layer 43 (see FIG. 3). Bumps 42 and the connection terminals of first electronic component 50 are connected.

Figure 4:
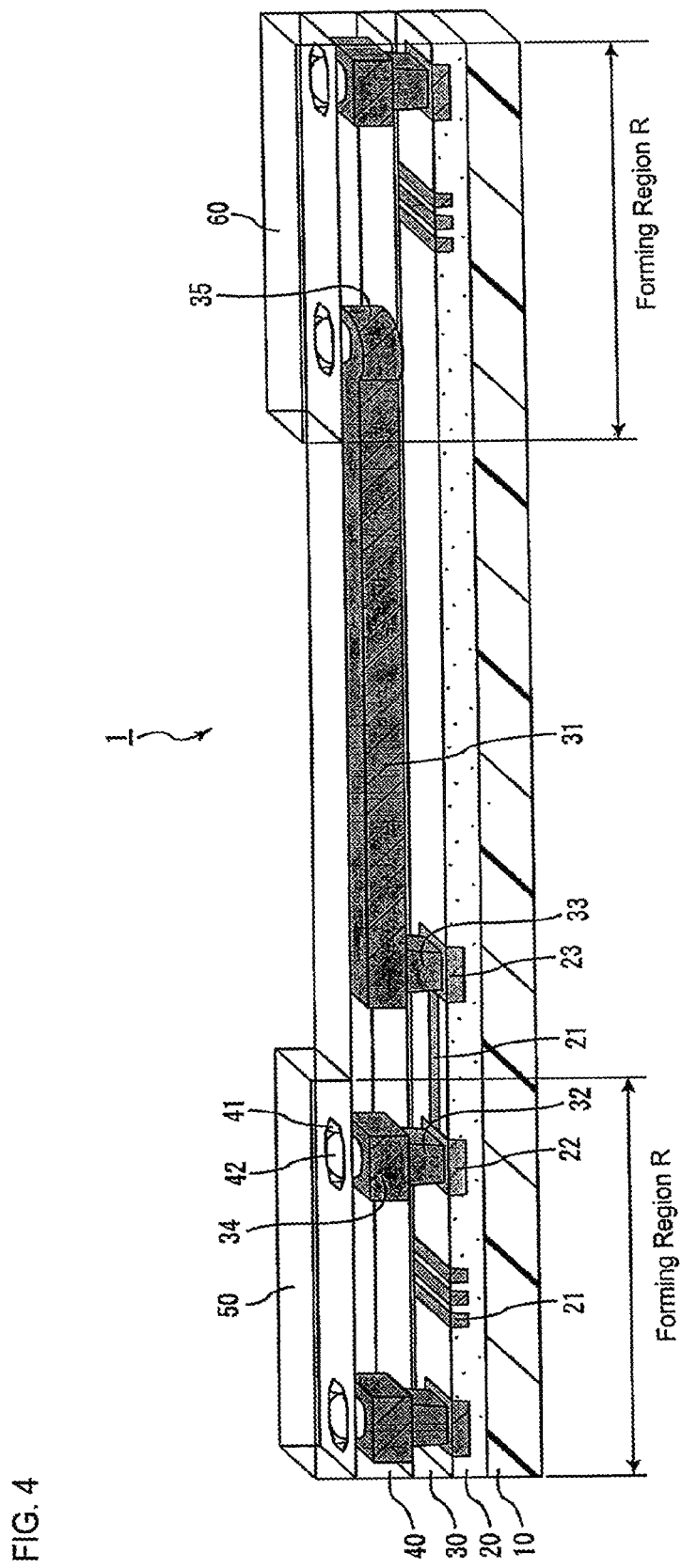
FIG. 4 schematically illustrates a perspective cross-sectional view partially showing an interposer according to an embodiment of the present invention as well as the side where a second electronic component is loaded.

FIG. 4 is a schematic view illustrating a perspective cross-section partially showing an interposer according to an embodiment of the present invention; the side on which the second electronic component is loaded is illustrated as well.

In the interposer of the present embodiment shown in FIG. 4, from the side of first electronic component 50, wiring is connected to first pads 34, to first via conductors 32, to first lands 22, to first wiring 21, to second lands 23, to second via conductors 33, to second wiring 31 and to second pads 35 in that order. Namely, from first pads 34 on which first electronic component 50 is loaded, wiring is pulled down to first insulation layer 20, then using first wiring 21 inside first insulation layer 20, a wiring distribution among the first lands is arranged, then wiring is pulled to second lands 23 which are positioned outside forming region (R) for pads 34. Then, from second lands 23, wiring is pulled up through second via conductors 33 to second wiring 31 on the second insulation layer, and through second wiring 31, a substantial portion of the connection between first electronic component 50 and second electronic component 60 is arranged.

Regarding the wiring between first electronic component 50 and second electronic component 60, the length of second wiring 31 is made greater than the length of first wiring 21. By setting so, the wiring resistance of the wiring between two electronic components may be reduced and an interposer suitable for large-volume signal transmission may be obtained. Especially, the percentage of the length of the second wiring to the entire wiring length connecting the first electronic component and the second electronic component is preferred to be 60-90%.

Figure 5:
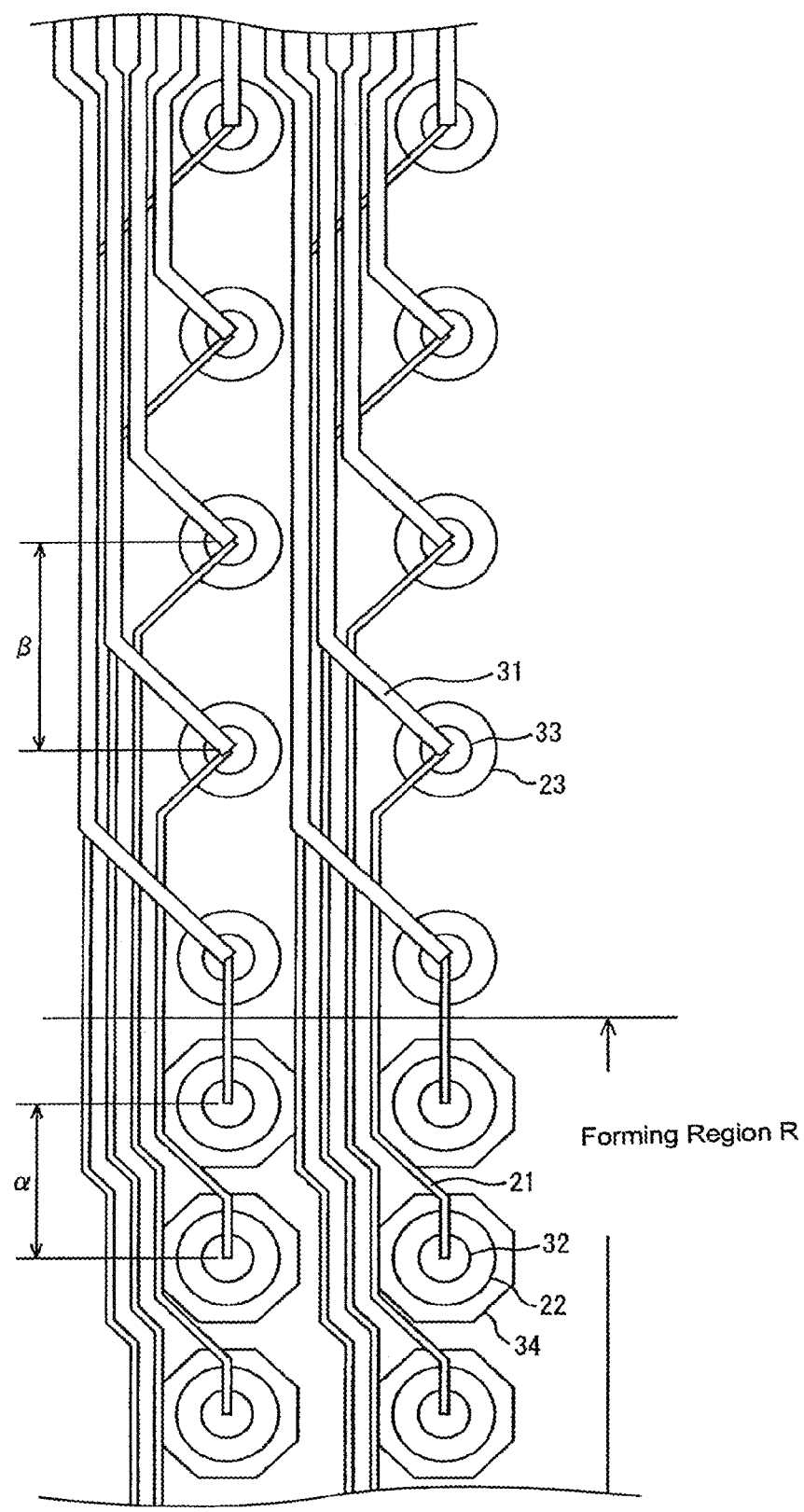
FIG. 5 schematically illustrates a top plan view partially showing an example of an interposer according to an embodiment of the present invention.

In the following, the interposer according to the present embodiment is described using a top plan view. FIG. 5 is a schematic top plan view partially illustrating an interposer according to an embodiment of the present invention. To show how the wiring inside the first insulation layer or second insulation layer looks, FIG. 5 schematically illustrates the wiring by viewing it through each layer. FIG. 5 shows first-pad forming region (R) and its surroundings, and outside (upper side) the region shown in FIG. 5 the second electronic component (second-pad forming region (R)) is positioned.

In first-pad forming region (R), multiple first lands 22 are formed. On each first land 22, first via conductor 32 is formed, and on each first via conductor 32, first pad 34 is formed. Namely, each octagonal region illustrated in FIG. 5 is the portion onto which a connection terminal (such as solder bump) of the first electronic component is connected. To each first land 22, first wiring 21 is connected, and first wiring 21 is pulled outside first-pad forming region (R) so as to be connected to second lands 23. On each second land 23, second via conductor 33 is formed, and to each second via conductor 33, second wiring 31 is connected. Second wiring 31 is integrated with the second pads, which are positioned outside (upper portion) the drawing and are not shown in the drawing. As shown in FIG. 5, in the present embodiment, compared with pitch (α) of first via conductor 32, pitch (β) of second via conductor 33 is made relatively large.

Also, in the present embodiment, the L/S of first wiring 21 is set 1 μm/1 μm, and the L/S of second wiring 31 is set 3 μm/3 μm. The width of second wiring 31 is made larger than that of first wiring 21.

Figure 6:
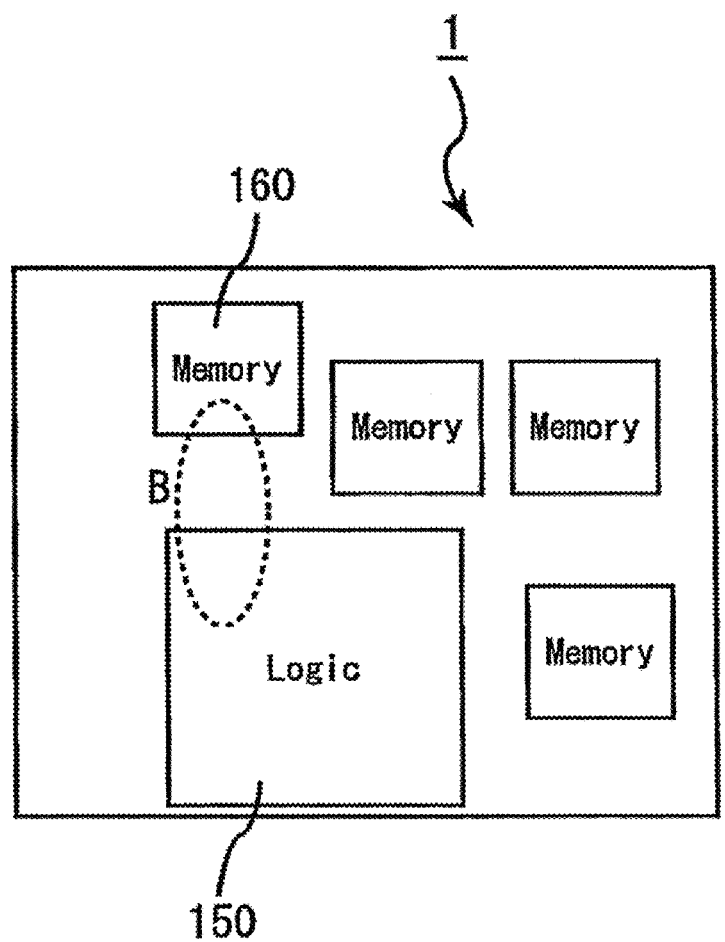
FIG. 6 schematically illustrates a top plan view showing a situation where an electronic component is loaded onto an interposer according to an embodiment of the present invention.

FIG. 6 is a schematic top plan view illustrating an example of how electronic components are loaded onto an interposer according to an embodiment of the present invention. In FIG. 6, the wiring situation among electronic components is omitted from the drawing.

Onto an interposer according to an embodiment of the present invention, multiple electronic components of multiple varieties may be loaded. The number and the varieties are not limited specifically; however, in interposer 1 shown in FIG. 6, one of logic 150 and four of memory 160 are loaded. Then, wiring between logic 150 and memory 160 is structured with the first wiring and second wiring described so far.

Figure 7:
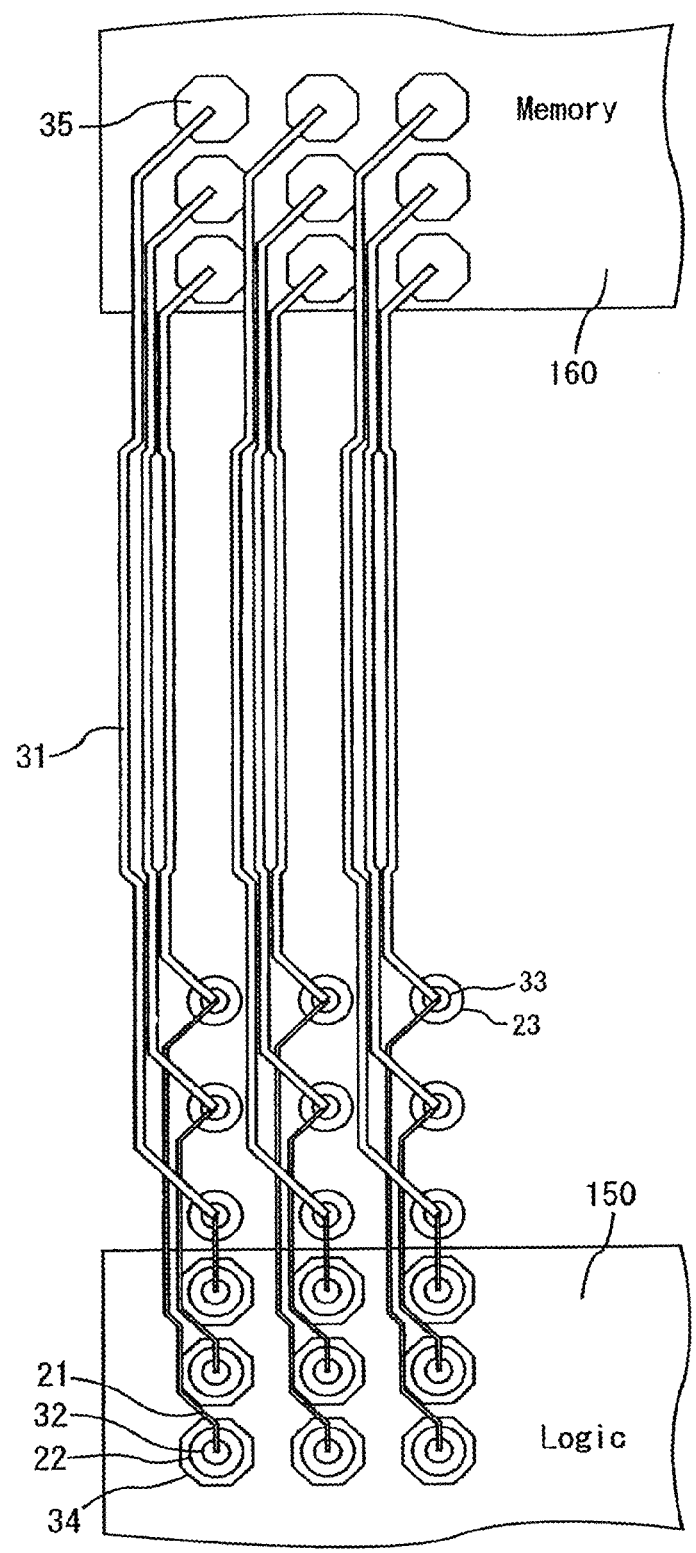
FIG. 7 illustrates an enlarged top plan view showing the region (Region (B) in FIG. 6) between the logic and memory shown in FIG. 6.

FIG. 7 is a top plan view illustrating the enlarged region (region (B) in FIG. 6) between the logic and memory shown in FIG. 6. FIG. 7 schematically illustrates part of the wiring pulled out of logic 150 and memory 160.

In the region shown in FIG. 7, to first lands 22 connected to first pads 34 on the side of logic 150, first wiring 21 is connected through first via conductors 32. Wiring 21 is pulled out to second lands 23 positioned outside the pad-forming region (R) for logic 150. Second wiring 31 is connected to second lands 23 through second via conductors 33. Second wiring 31 is extended to the side of memory 160, and is connected to second pads 35 on the side of memory 160. Through second wiring 31, the wiring on the side of logic 150 and wiring on the side of memory 160 are connected.

As clearly seen in FIG. 7, the L/S of first wiring 21 is smaller than the L/S of second wiring 31, and the length of second wiring 31 is greater than that of first wiring 21. Namely, it indicates that a substantial portion of the wiring between logic 150 and memory 160 is structured with second wiring 31.

In the following, a method of manufacturing an interposer according to the present embodiment is described with reference to the drawings.

In the description of the manufacturing method, a method is described to form the wiring in the portion directly under where the first electronic component is loaded, namely, in the reflected region of the first electronic component. However, in other regions such as the reflected region of the second electronic component or the region between the first electronic component and the second electronic component, the same method may be used to form wiring.

Figure 8:
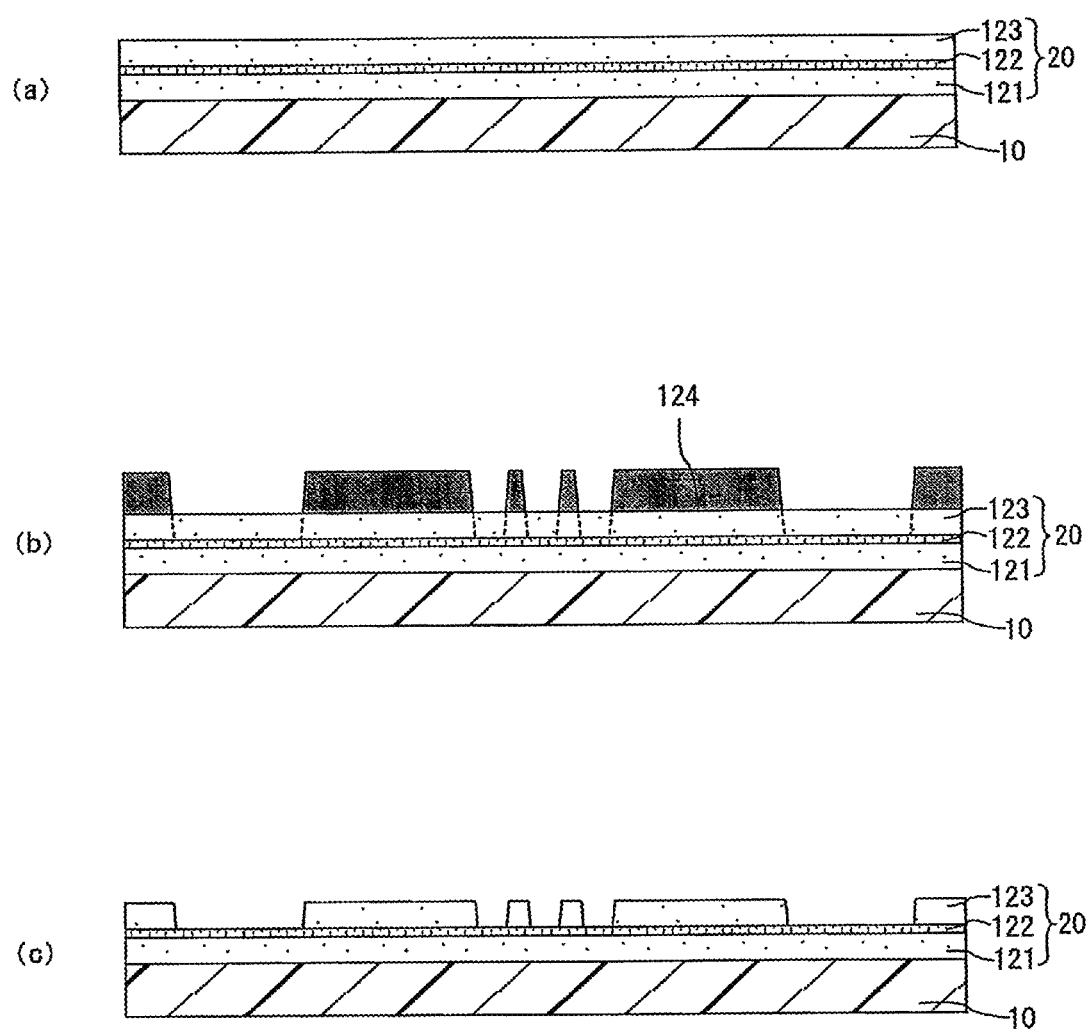
FIGS. 8(a), 8(b) and 8(c) schematically illustrate cross-sectional views partially showing the steps of manufacturing an interposer according to the first embodiment.
Figure 9:
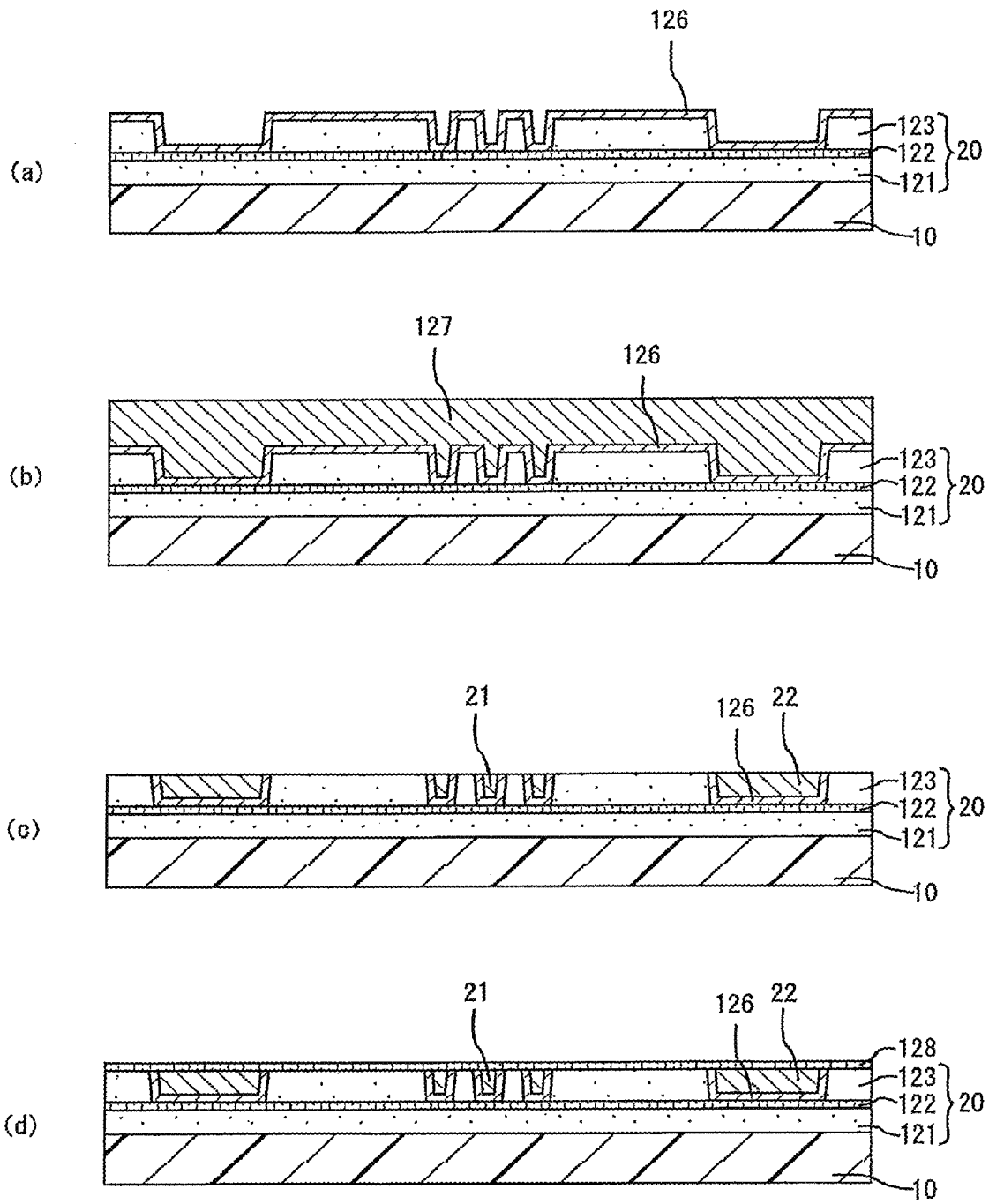
FIGS. 9(a), 9(b), 9(c) and 9(d) schematically illustrate cross-sectional views partially showing the steps of manufacturing an interposer according to the first embodiment.

FIGS. 8(a), 8(b) and 8(c), as well as FIGS. 9(a), 9(b), 9(c) and 9(d) are cross-sectional views schematically illustrating part of the steps in manufacturing the interposer according to the first embodiment. First, as shown in FIG. 8(a), on support substrate 10, first insulation layer 20 (first SiO$_2$ layer 121, Si$_3$N$_4$ layer 122 and second SiO$_2$ layer 123) is formed by thin-film deposition. As for support substrate 10, a silicon wafer is used. On the top surface of silicon wafer 10, first SiO$_2$ layer 121, Si$_3$N$_4$ layer 122 and second SiO$_2$ layer 123 are each formed by thin-film deposition using a CVD (chemical vapor deposition) method.

Next, by applying resist 124 and by exposing it to light and developing it, resist 124 is removed from the predetermined positions corresponding to those to form openings in second SiO$_2$ layer 123. Those steps are shown in their entirety in FIG. 8(b).

Next, by conducting dry etching (reactive ion etching), second SiO$_2$ layer 123 is etched in the portion where resist 124 is not formed. In doing so, a pattern such as that shown in FIG. 8(c) is formed on second SiO$_2$ layer 123. When conducting dry etching, Si$_3$N$_4$ layer 122 plays a role as an etching stopper.

Next, as shown in FIG. 9(a), on the surface of second SiO$_2$ layer 123, seed layer 126 is formed, for example, by sputtering. In the present embodiment, seed layer 126 is structured with sputtered films of TaN, Ta and Cu in that order from the bottom, but it is not limited to such.

Next as shown in FIG. 9(b), using seed layer 126 as an electricity-supply layer, electrolytic copper plating is performed to form electrolytic copper-plated layer 127. Electrolytic copper plating may be conducted by a conventionally known method.

Next, as shown in FIG. 9(c), CMP (Chemical Mechanical Polishing) is conducted to remove part of electrolytic copper-plated layer 127 as well as seed layer 126 which is positioned on the surface of second SiO$_2$ layer 123. The CMP may be conducted using a method and equipment known as a conventional damascene method. Then, the electrolytic copper-plated layer left after conducting the CMP becomes first lands 22 and first wiring 21.

Through the above steps, the first insulation layer, first lands and first wiring may be formed. Although the method of forming the second lands is not shown in the drawing, it is similar to the method of forming the first lands. Wiring may be formed in such a way that the first lands and the second lands are connected through the first wiring. Then, as shown in FIG. 9(d), inorganic layer 128 such as an Si3N4 layer is formed on the surface by, for example, CVD. Inorganic layer 128 is formed to enhance the adhesiveness between the second insulation layer and first insulation layer.

Figure 11:
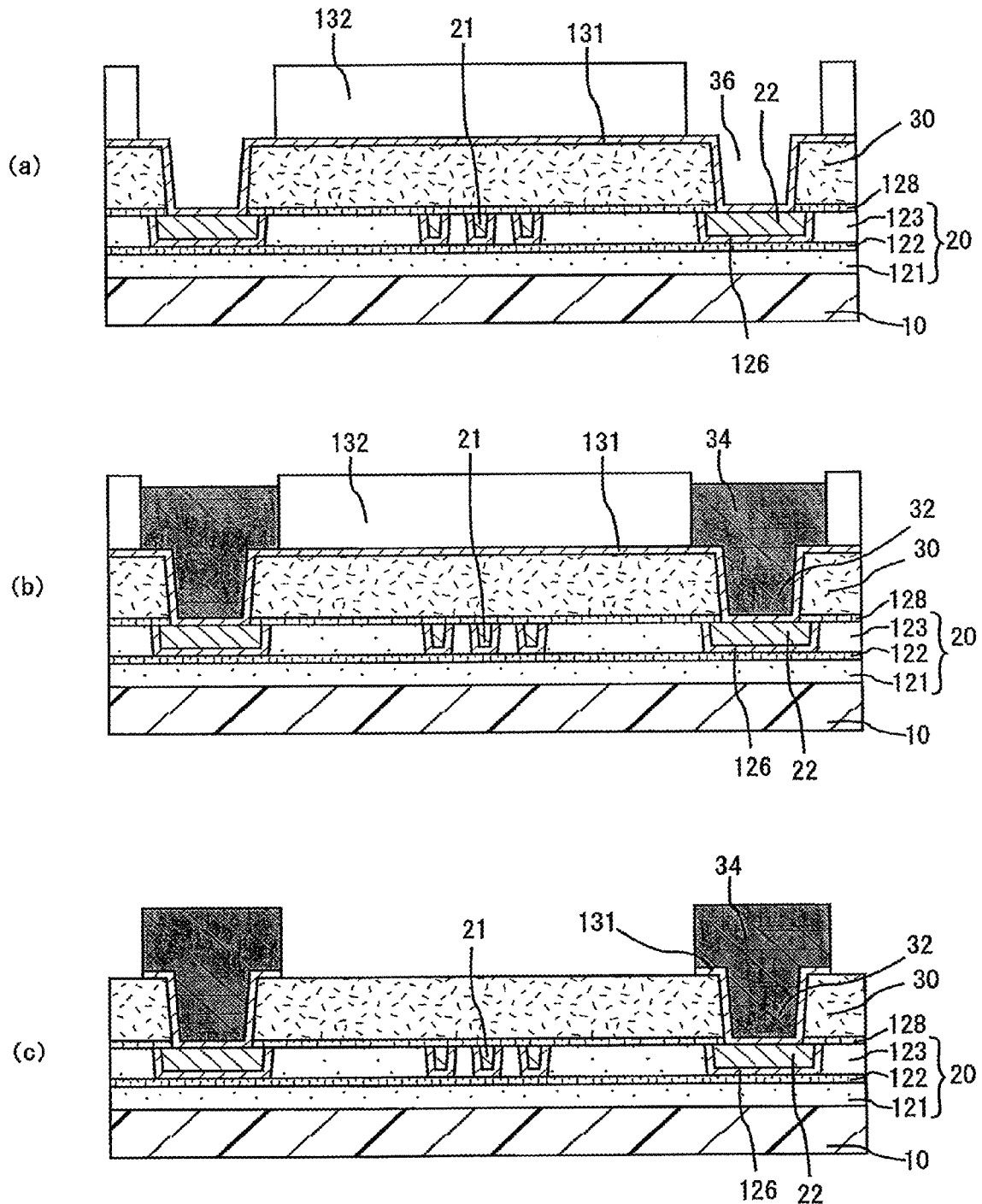
FIGS. 11(a), 11(b) and 11(c) schematically illustrate cross-sectional views partially showing the steps of manufacturing an interposer according to the first embodiment.

FIGS. 10(a), 10(b), 10(c) and 10(d) as well as FIGS. 11(a), 11(b) and 11(c) are cross-sectional views schematically illustrating part of the method of manufacturing an interposer according to the first embodiment. First, as shown in FIG. 10(a), second insulation layer 30 is formed on the first insulation layer and first wiring, and openings 36 are formed as shown in FIG. 10(b). As a method of forming second insulation layer 30, for example, a method in which uncured photosensitive polyimide resin is applied by a roll-coater or the like may be used.

As a method of forming openings, a process to expose to light and develop the second insulation layer may be used. Among the openings formed in the second insulation layer, those formed on the first lands become the first opening portions, and those formed on the second lands become second opening portions. Then, as shown in FIG. 10(c), the inorganic layer exposed through the first opening portions is removed by, for example, a reactive ion etching.

Next, as shown in FIG. 10(d), seed layer 131 is formed on the surface (including the wall surfaces of openings 36) of second insulation layer 30 and on the top surfaces of first lands 22 exposed through openings 36. Seed layer 131 is formed, for example, by sputtering and is made of Ti and Cu. Although not shown in the drawing, a seed layer is formed on the top surfaces of the second lands as well.

Next, as shown in FIG. 11(a), plating resist 132 is formed, exposed to light and developed through a mask. By doing so, plating resist 132 is removed from the positions to form first pads 34 (see FIG. 11(b)). As for the plating resist, for example, a photosensitive dry film or the like may be used. Although not shown in the drawing, when removing the plating resist, the plating resist on the openings (second opening portions) in the second insulation layer formed on the second lands is removed, and the plating resist is further removed according to the configuration of the second wiring pattern.

In the following, as shown in FIG. 11(b), using seed layer 131 as an electricity-supply layer, electrolytic copper plating is performed to deposit copper plating in the portions from which plating resist 132 is removed. By doing so, first via conductors 32 are formed in second insulation layer 30, and first pads 34 are further formed on second insulation layer 30. In addition, although not shown in the drawing, the second via conductors are formed in the second insulation layer by electrolytic copper plating, and the second wiring is further formed on the second insulation layer.

Next, as shown in FIG. 11(c), the rest of the plating resist is removed and seed layer 131 beneath the removed plating resist is also removed by etching. Etching seed layer 131 is not limited to a specific method, but from the viewpoint of suppressing the over-etching of electrolytic copper plating, dry etching (reactive ion etching) is preferred.

Through the above steps, the second insulation layer, first via conductors and first pads may be formed. Also, not shown in the drawing, the second via conductors, second wiring and second pads may be formed in a similar manner.

Figure 12:
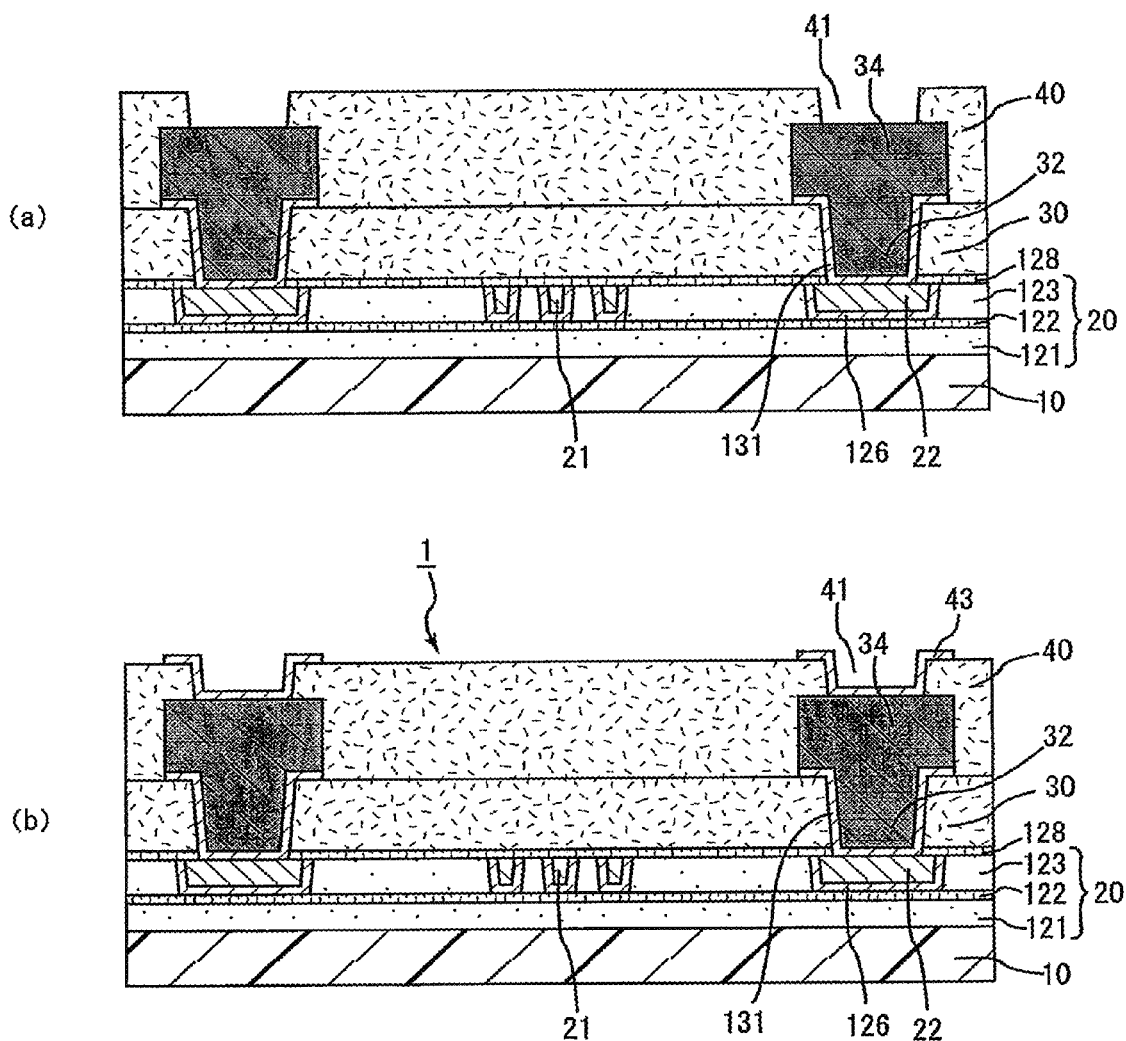
FIGS. 12(a) and 12(b) schematically illustrate cross-sectional views partially showing the steps of manufacturing an interposer according to the first embodiment.

FIGS. 12(a) and 12(b) are cross-sectional views schematically illustrating part of the steps of manufacturing an interposer according to the first embodiment. First, yet another organic insulation layer 40 is formed on second insulation layer 30. Then, on the newly formed organic insulation layer 40, openings 41 are formed. The newly formed organic layer 40 becomes protective layer 40. Those steps are shown in their entirety in FIG. 12(a). As the organic insulation layer for protective film 40, a similar material as is used in second insulation layer 30 may be used. Also, as for a method to form openings 41, a similar method as is used to form openings 36 in second insulation layer 30 may be used.

Next, as shown in FIG. 12(b), in openings 41 formed in protective film 40, barrier metal layer 43 is formed. Barrier metal layer 43 is formed, for example, by sputtering tantalum nitride and tantalum one after another. The material for structuring and the method of forming the barrier metal layer are not limited specifically. Through those steps, interposer 1 of the present embodiment may be complete. Forming a protective film and forming the barrier metal layer are carried out according to requirements. In addition, although omitted from the drawing, on the surface of barrier metal layer 43 exposed through the openings in protective film 40, Ni/Au plating is performed. That is for ensuring adhesiveness between solder and pads 34 when later-described solder bonding is conducted.

Figure 13:
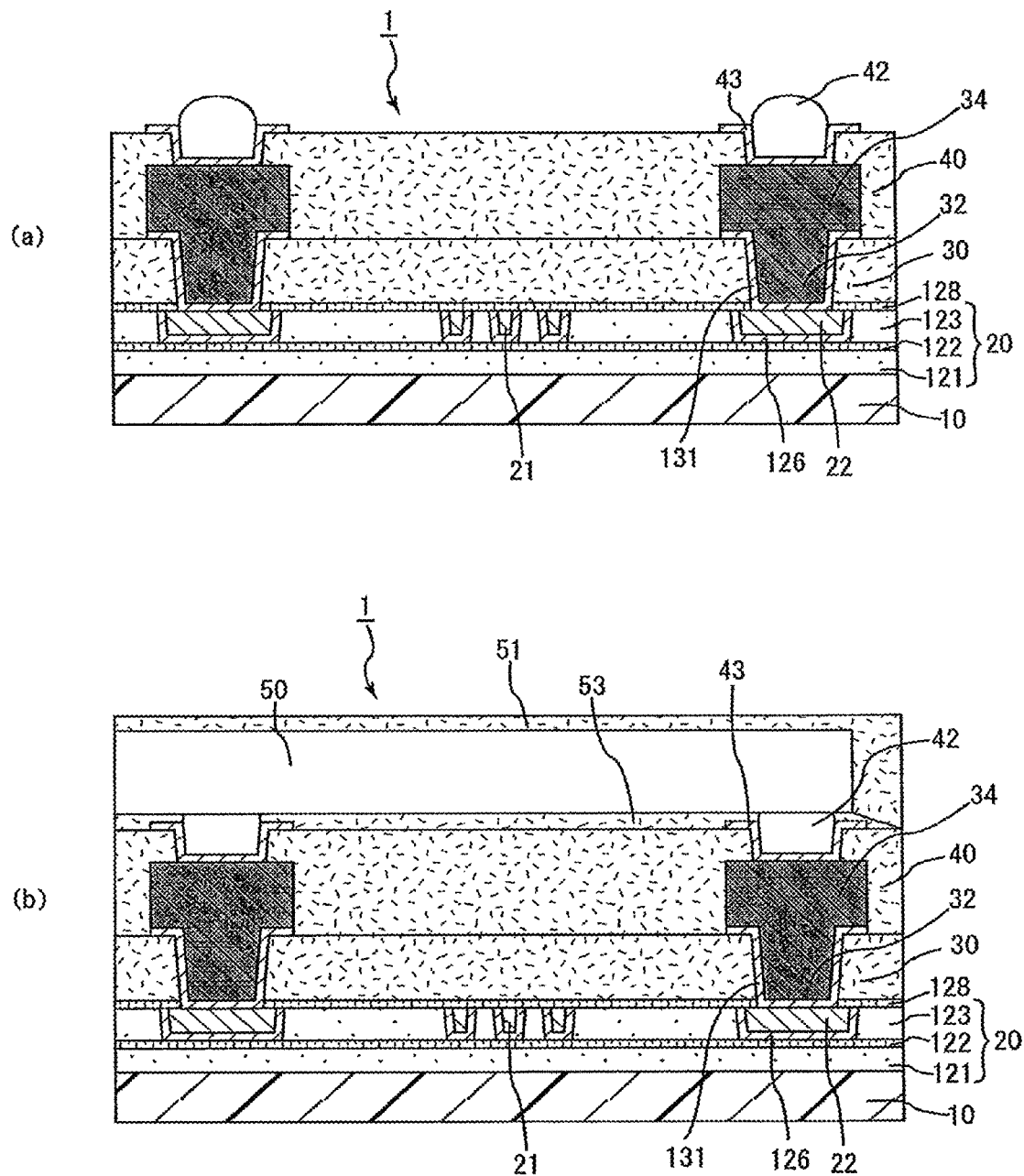
FIGS. 13(a) and 13(b) schematically illustrate cross-sectional views partially showing the steps of loading an electronic component onto an interposer according to the first embodiment.

In the following, the process to load an electronic component onto the manufactured interposer is described. FIGS. 13(a) and 13(b) are cross-sectional views schematically illustrating an example of the process to load an electronic component onto the interposer of the first embodiment. First, as shown in FIG. 13(a), on pads 34 (barrier metal layer 43), bumps 42 are formed with solder.

Next, first electronic component 50 is flip-chip mounted on interposer (1) through bumps 42. Then, underfill resin 53 is filled between first electronic component 50 and the interposer and cured. Next, the surroundings of first electronic component 50 are sealed with sealing resin 51, and loading the electronic component onto interposer (1) is complete. Those steps are shown in their entirety in FIG. 13(b). As for the underfill resin and sealing resin, resin usually used for sealing electronic components may be used.

Also, when silicon wafer is used as a support substrate and an interposer is formed on the silicon wafer, by using silicon wafer sufficiently large for the size of an interposer, multiple interposers may be formed on a sheet of silicon wafer. When multiple interposers are formed on a sheet of silicon wafer, at an appropriate time such as before or after a step to load an electronic component, each interposer may be divided by cutting the silicon wafer into units by a method of dicing or the like. In doing so, interposers may be manufactured efficiently.

In the following, the effects of an interposer of the present embodiment and a method of manufacturing such an interposer are listed.

(1) In the interposer of the present embodiment, on the first insulation layer made of inorganic material, the first lands, second lands and first wiring are formed. The first wiring electrically connects the first lands and the second lands. Since the first wiring is suitable for a fine distribution, a fine distribution definitely required among connection terminals of the first electronic component may be arranged with the first wiring.

(2) Also, the second lands are formed outside the first-pad forming region. Therefore, from the first lands electrically connected to the connection terminals (and the first pads connected to the connection terminals) on the first electronic component, using the first wiring, which is fine wiring, wiring is distributed among the first lands, then the first wiring is pulled outside of the first-pad forming region (the reflected region of the first electronic component) to be connected to the second lands. Namely, wiring may be pulled out from the region where fine wiring is required to the region where fine wiring is not particularly required.

(3) Also, since wiring is distributed using the fine wiring formed in the first insulation layer, with the reduced number of layers required to distribute wiring, fanning out may be achieved. Accordingly, with a small number of layers, it is possible to deal with finer features of the terminals of an electronic component.

(4) Also, the length of the second wiring is longer than the length of the first wiring. The wiring to connect the first pads and second pads is mainly arranged with the second wiring, which has a low wiring resistance per unit length (wiring with a long wiring length and great thickness). Therefore, the wiring resistance of the wiring between two electronic components is effectively reduced, making an interposer suitable for large-volume signal transmission.

(5) Also, the first lands, second lands and first wiring are formed by a damascene method. Thus, the surface having the first insulation layer, first lands, second lands and first wiring is made flat. Accordingly, on that surface, second insulation layer, first via conductors, second via conductors and second wiring may be accurately formed and an interposer having highly flat characteristics may be obtained as well.

(6) Also, the support substrate is made of silicon. Since a support substrate made of silicon has highly flat characteristics, fine wiring may be formed on that surface. Furthermore, by employing silicon as a support substrate, the rigidity of an interposer is enhanced. Thus, warping of the interposer caused by different thermal expansion coefficients among multiple loaded electronic components and the interposer may be effectively suppressed.

(7) Also, since a protective film having openings is further formed on the first pads and the seconds pads, a wiring layer in the inner portion may be suitably protected.

(8) Also, since one layer each of the first insulation layer and the second insulation layer is formed, the entire thickness of the interposer may be reduced, thus lowering the height of the substrate when electronic components are loaded. In addition, considering that the wiring length between electronic components is made substantially short, lowering of wiring resistance may be achieved.

(9) Also, since an inorganic film is formed between the first insulation layer and the second insulation layer, adhesiveness between the first insulation layer and second insulation layer may be improved.

(10) Also, in the method of manufacturing an interposer according to the present embodiment, a step to form the first wiring by a damascene method and a step to form the second wiring by a semi-additive method are taken. By doing so, an interposer may be manufactured in which the first wiring to distribute fine wiring is accurately formed, and the second wiring, which has a longer wiring length and a greater thickness (small wiring resistance per length), is formed conveniently at low cost. Thus, according to the method of manufacturing an interposer of the present embodiment, when arranging wiring between the first electronic component and the second electronic component, for example, fine distribution definitely required among the connection terminals of the first electronic component is arranged with the first wiring, and a substantial wiring portion between the first electronic component and second electronic component is structured with the second wiring which has a greater thickness. Accordingly, an interposer may be manufactured in which wiring resistance is effectively reduced and which is suitable for large-volume signal transmission.

Second Embodiment

In the following, the second embodiment, one of the embodiments of the present invention, is described. In the interposer of this embodiment, a power-source layer and/or a ground layer is formed in the first insulation layer positioned under the second wiring of the interposer described in the first embodiment; or a passive element having at least a capacitor, inductor or resistor is provided. The first insulation layer under the second wiring indicates a predetermined spot of the first insulation layer positioned between the first-pad forming region and the second-pad forming region. For example, if a ground layer is formed in the first insulation layer, a microstrip structure is formed that includes the second wiring positioned directly over the ground layer. As a result, characteristic impedance may be matched, allowing signal transmission to be steady.

In the present embodiment, effects (1)-(10) described in the first embodiment as well as the following effect may be shown.

(11) Since fine wiring is not required to be arranged in the first insulation layer under the region where wiring is formed with second wiring (a region between the electronic components), the region often creates dead space. By forming, for example, a power-source layer or a passive element in that dead space, such a region is used efficiently, making the interposer highly integrated without having a useless portion. Accordingly, thin and compact features are achieved in the entire interposer, and it is possible to add various functions such as a reinforced power source or enhanced signal characteristics.

Third Embodiment

In the following, the third embodiment, one of the embodiments of the present invention, is described.

Figure 14:
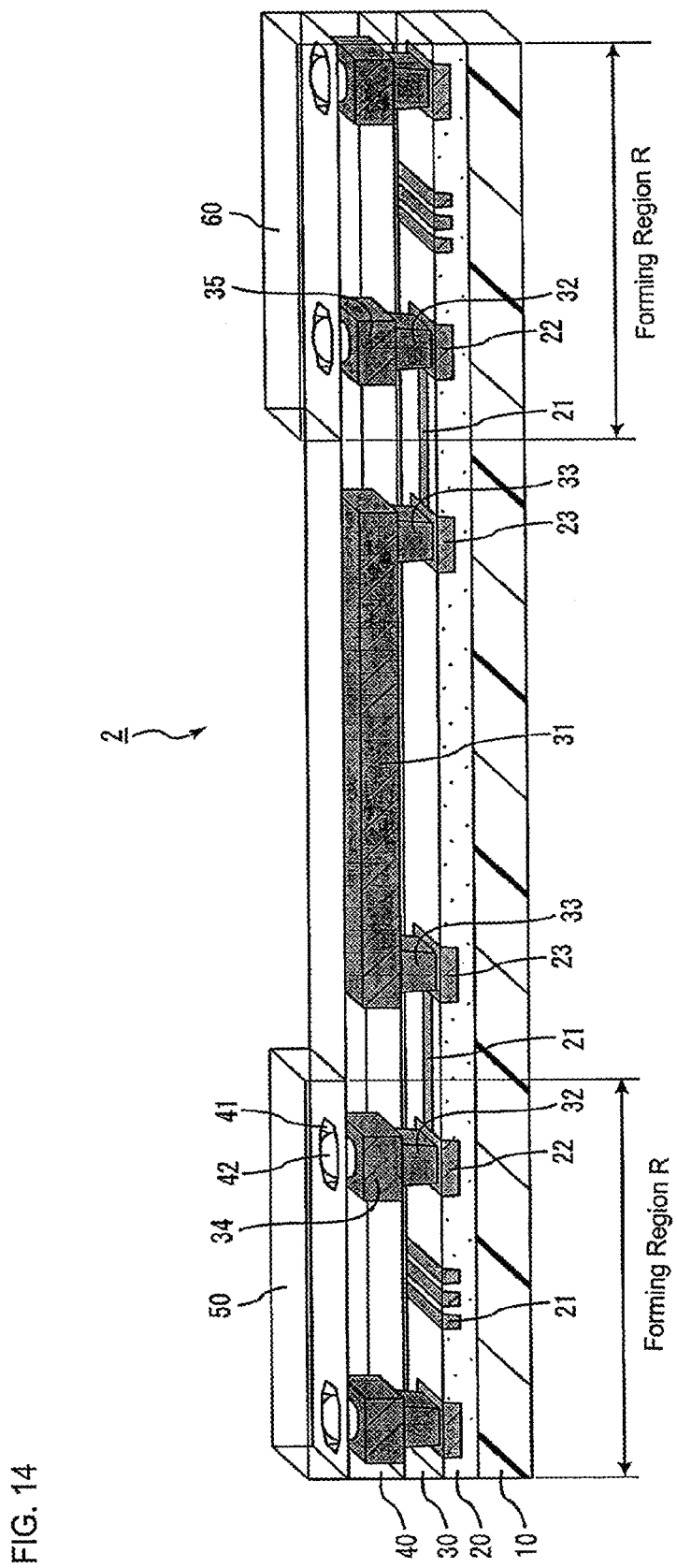
FIG. 14 schematically illustrates a perspective cross-sectional view partially showing an interposer according to another embodiment of the present invention.

FIG. 14 schematically illustrates a perspective cross-sectional view partially showing an interposer according to another embodiment of the present invention. In interposer 2 of this embodiment, in the reflected region of second electronic component 60, similar to the reflected region of first electronic component 50, first lands 22, second lands 23, first wiring 21, first via conductors 32 and second via conductors 33 are also formed; and second pads 35 are electrically connected to second wiring 31 through first via conductors 32, first lands 22, first wiring 21, second lands 22 and second via conductors 33.

In the present embodiment, effects (1)-(10) described in the first embodiment as well as the following effect may be shown.

(12) In the interposer according to the present embodiment, the number of connection terminals on the side of the second electronic component is large and their pitch is narrow. Thus, even when wiring is required to be pulled from the reflected region of the second electronic component, it is possible to deal with finer features of the terminals of an electronic component with a small number of layers, and without forming multiple layers.

Fourth Embodiment

Figure 15:
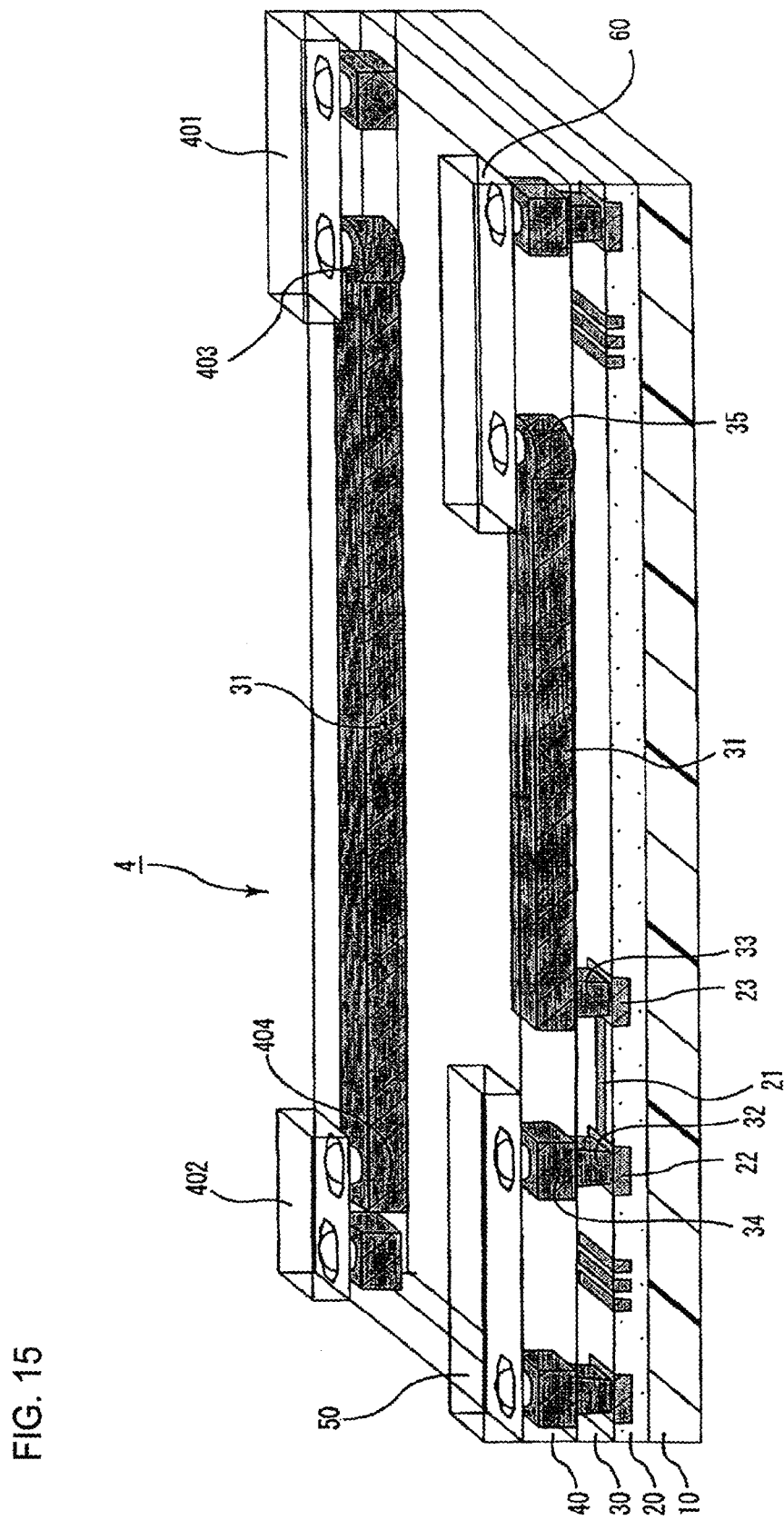
FIG. 15 schematically illustrates a perspective cross-sectional view partially showing an interposer according to yet another embodiment of the present invention.

The interposer according to this embodiment is structured in such a way that specific electronic components among multiple electronic components are connected using only the second wiring. FIG. 15 schematically illustrates a perspective cross-sectional view partially showing an interposer according to yet another embodiment of the present invention. Interposer 4 shown in FIG. 15 is further structured with, for example, third pads 403 to load third electronic component 401 and fourth pads 404 to load fourth electronic component 402 onto the interposer according to the first embodiment as shown in FIG. 4. Then, third pads 403 and fourth pads 404 are connected through second wiring 31.

In interposer 4 in this embodiment, wiring is connected from third pads 403 on the side of third electronic component 401 to second wiring 31 and to fourth pads 404 in this order. Between third electronic component 401 and fourth electronic component 402, first wiring, first lands and second lands are not formed. First electronic component 50 and second electronic component 60 are connected through first wiring 21 and second wiring 31 similar to the first embodiment.

As for the electronic components used in the fourth embodiment, for example, the third electronic component is a power-source regulator module and the fourth electronic component is a CPU. By connecting those electronic components only through the second wiring, the resistance of wiring between the electronic components may be further lowered. As a result, without causing a voltage drop in the second wiring, appropriate voltage may be added to electronic components such as a CPU.

Fifth Embodiment

Figure 16:
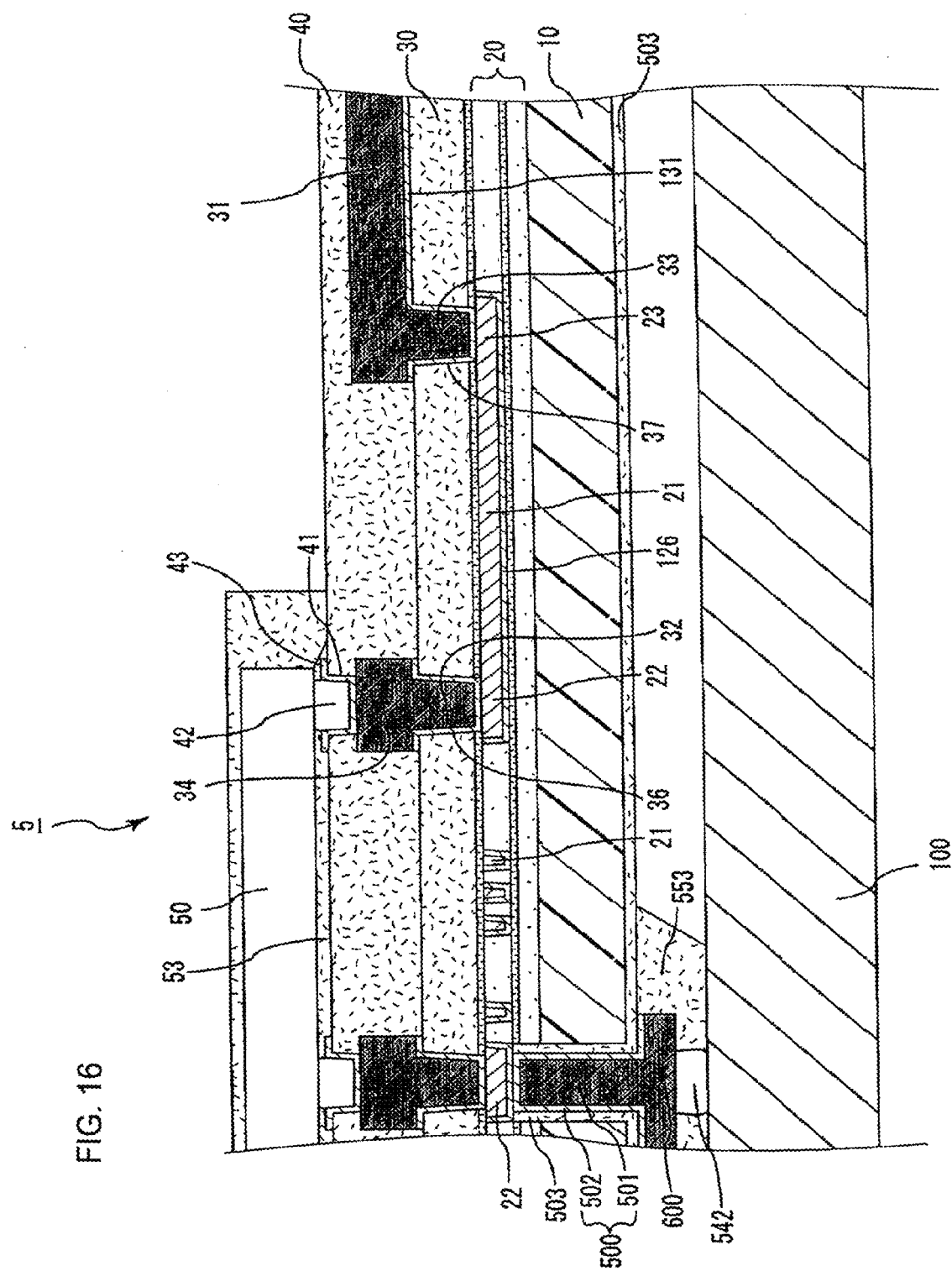
FIG. 16 schematically illustrates a cross-sectional view partially showing an interposer according to yet another embodiment of the present invention.

FIG. 16 schematically illustrates a cross-sectional view partially showing an interposer according to yet another embodiment of the present invention. In interposer 5 shown in FIG. 16, penetrating electrodes 500 are formed in support substrate 10.

Penetrating electrode 500 is structured with copper-plated layer 501 and conductive thin-film 502 beneath the copper-plated layer. Penetrating electrode 500 and support substrate 10 are separated by insulative film 503. Insulative film 503 is also formed on the back surface of support substrate 10.

The upper side (on the front-surface side of the support substrate) of penetrating electrode 500 is connected to the conductor (first land 22 in FIG. 16) formed in first insulation layer 20. The lower side (on the back-surface side of the support substrate) of penetrating electrode 500 is connected to pad 600 (wiring) formed on the back surface of support substrate 10. Namely, pads 600 (wiring) formed on the back surface of support substrate 10 and first wiring 21 (first lands 22) are electrically connected through penetrating electrodes 500. Also, on pads 600, bumps 542 are formed. Through bumps 542, interposer 5 is mounted on printed wiring board 100. Between printed wiring board 100 and interposer 5, underfill resin 553 is filled. Interposer 5 and printed wiring board 100 may be connected only through bumps 542, or they may be connected through both bumps and wiring.

The material for insulative film 503 is not specifically limited, but an inorganic insulative film such as an $SiO_2$ film, or an organic insulative film made of resin may be used. Here, an example is shown using an organic insulative film as insulative film 503.

The method of manufacturing an interposer according to the fifth embodiment is substantially similar to the method of manufacturing an interposer according to the first embodiment, except for the step to form penetrating electrodes. Therefore, among the steps of manufacturing an interposer according to the fifth embodiment, those different from the method of manufacturing an interposer according to the first embodiment are described.

Figure 17:
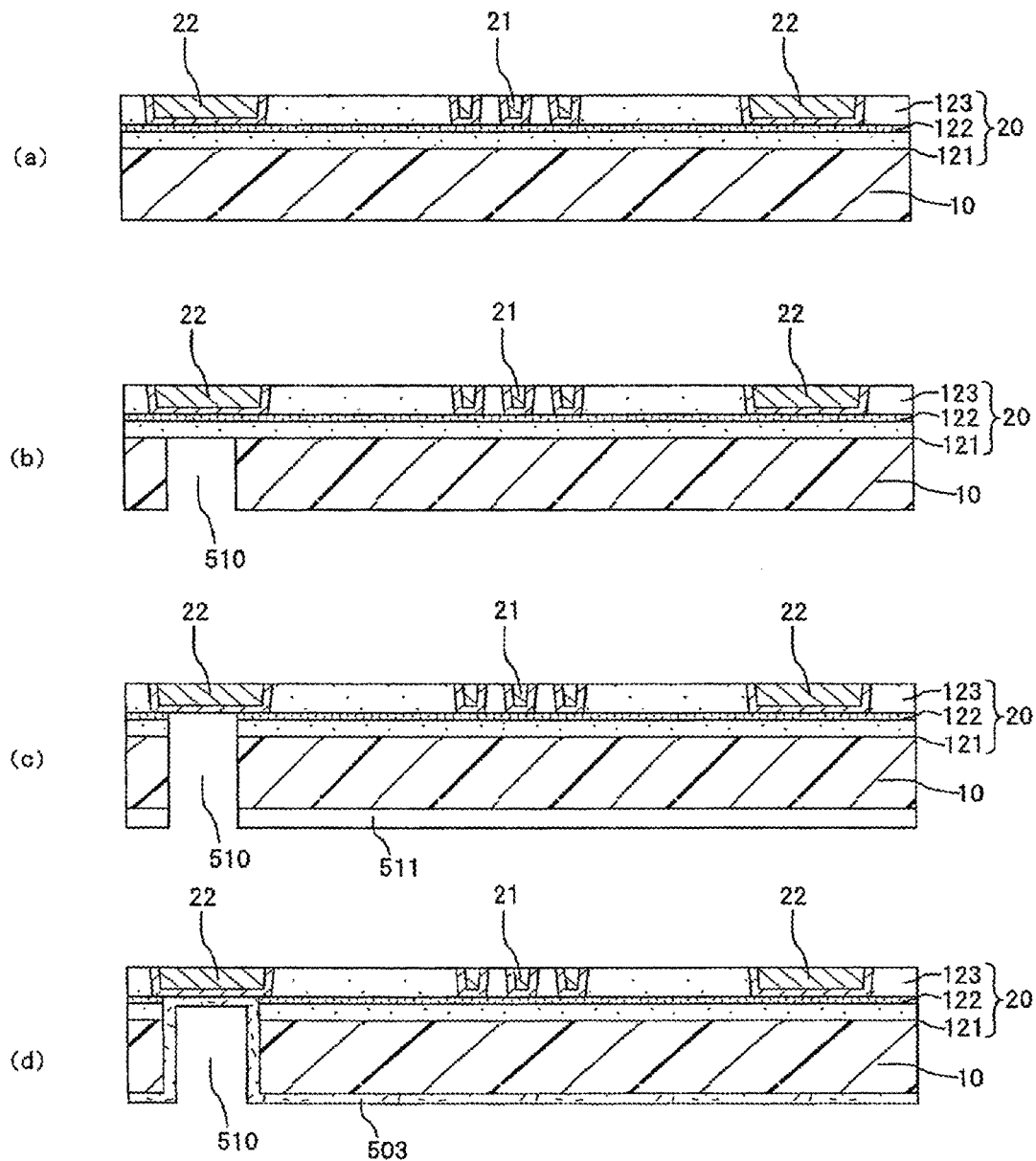
FIGS. 17(a), 17(b), 17(c) and 17(d) schematically illustrate cross-sectional views partially showing the steps of manufacturing an interposer according to the fifth embodiment.
Figure 18:
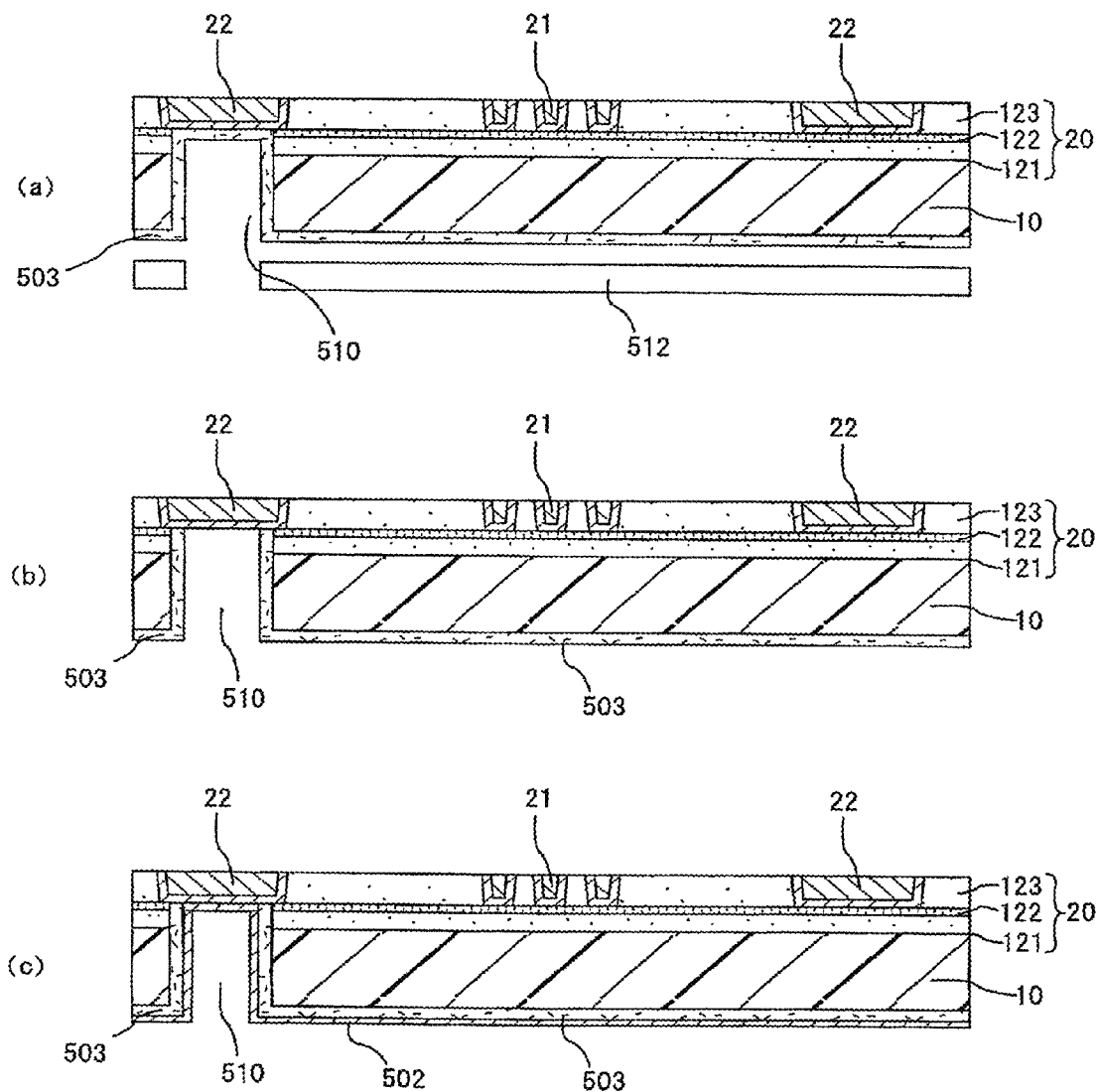
FIGS. 18(a), 18(b) and 18(c) schematically illustrate cross-sectional views partially showing the steps of manufacturing an interposer according to the fifth embodiment.
Figure 19:
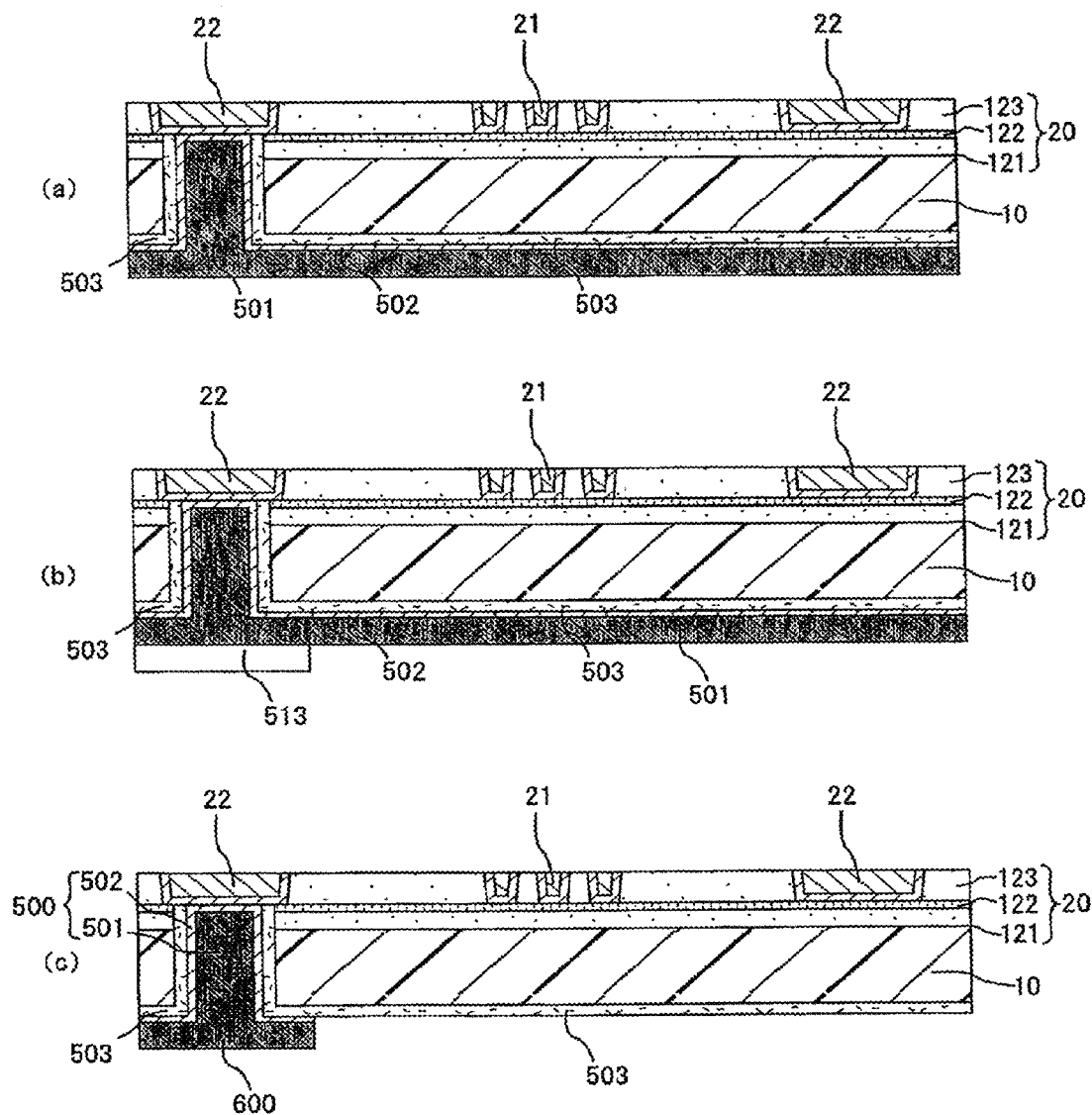
FIGS. 19(a), 19(b) and 19(c) schematically illustrate cross-sectional views partially showing the steps of manufacturing an interposer according to the fifth embodiment.

FIGS. 17(*a*), 17(*b*), 17(*c*), 17(*d*), FIGS. 18(*a*), 18(*b*), 18(*c*) and FIGS. 19(*a*), 19(*b*), 19(*c*) are schematic cross-sectional views partially showing the steps of manufacturing an interposer according to the fifth embodiment. In this embodiment, by taking similar steps of manufacturing an interposer shown in the first embodiment, a substrate having a structure similar to that in FIG. 9(*c*) described in the first embodiment is produced (see FIG. 17(*a*)).

Next, as shown in FIG. 17(*b*), by using, for example, a UV laser, opening 510 is formed at a predetermined position in support substrate 10. The method to form opening 510 is not limited to a specific method; dry etching (reactive ion etching) or wet etching using an alkaline solution may be employed. Furthermore, as shown in FIG. 17(*c*), resist 511 is patterned so as to expose opening 510. Then, using resist 511 as a mask, dry etching (reactive ion etching) is performed by etching first $SiO_2$ layer 121 and $Si_3N_4$ layer 122 in that order to expose the bottom surface of first land 22.

Next, as shown in FIG. 17(*d*), using, for example, a dip coating method or a spin coating method, liquid resin is applied on the bottom-surface side of support substrate 10, and dried at about 200° C. for an hour to form insulative film 503. At that time, insulative film 503 is formed on the bottom surface of support substrate 10 and on the wall surface of opening 510. As for a liquid resin used in this step, from a viewpoint as described later that insulative film 503 on the surface of first land 22 may be easily removed, a photosensitive resin (such as brand name: WPR, series No. 5100, made by JSR Corporation) is preferred to be used. Specifically, a liquid resin is listed which contains: methyl ethyl ketone 20-30 wt. %, ethyl lactate 20-30 wt. %, filler 15-25 wt. %, novolak resin 5-15 wt. %, melamine compound 1-10 wt. %, phenolic resin 1-10 wt. %, crosslinked rubber 1-10 wt. %, epoxy compound 1-5 wt. %, low molecular-weight phenolic resin 1-5 wt. %, coupling agent 0.1-3 wt. % and triazine photosensitizer 0.1-3 wt. %. As for a method of forming an organic insulative film, other than a spin coating method and a dip coating method, for example, a vacuum vapor deposition method is listed.

Next, as shown in FIG. 18(*a*), opening 510 is exposed to light through mask 512, which has an opening corresponding to opening 510. Furthermore, as shown in FIG. 18(*b*), by a developing procedure, insulative film 503 is removed from the exposed portion (the bottom portion of opening 510). Through the above process, the bottom surface of first land 22 is exposed again on the back-surface side of support substrate 10.

Next, as shown in FIG. 18(*c*), conductive thin film 502 is formed on the lower surface of exposed first land 22 and on the surface of insulative film 503. Conductive thin film 502 is made, for example, of Ni/Cu and is formed by sputtering. However, the material of conductive thin film 502 is not limited to such. Also, a method to form conductive thin film 502 is not limited to sputtering; for example, electroless plating may also be employed. Furthermore, as shown in FIG. 19(*a*), electrolytic copper plating is performed using conductive thin film 502 as an electricity-supply layer to form copper-plated layer 501.

Next, as shown in FIG. 19(*b*), resist 513 is formed at a position where a pad will be formed in copper-plated layer 501. Next, as shown in FIG. 19(*c*), the portion of copper-plated layer 501 and conductive thin film 502 where resist 513 is not formed is removed by etching. Through the above process, penetrating electrode 500 and pad 600 are formed.

In the present embodiment, effects (1)-(10) described in the first embodiment as well as the following effect may be shown.

(13) By forming penetrating electrodes in the support substrate, the interposer and a printed wiring board are connected through solder bumps. As a result, the wiring distance is shortened in contrast to a situation where both are connected by wiring. In doing so, in the wiring from the printed wiring board to electronic components such as a semiconductor element, an increase in resistance is suppressed and a drop in electronic voltage before reaching electronic components such as a semiconductor element may be suppressed effectively.

(14) Also, since the interposer of this embodiment includes an insulative film made of organic resin, the thermal expansion coefficient of the interposer is large in contrast to a situation in which an inorganic insulative film is formed as an insulative film. Therefore, inconsistency of thermal expansion coefficients between a printed wiring board mainly made of resin and the interposer may be eased to a certain degree. Accordingly, connection reliability in the joint portion (bumps) between the interposer and a printed wiring board may be achieved.

Other Embodiments

Figure 20:
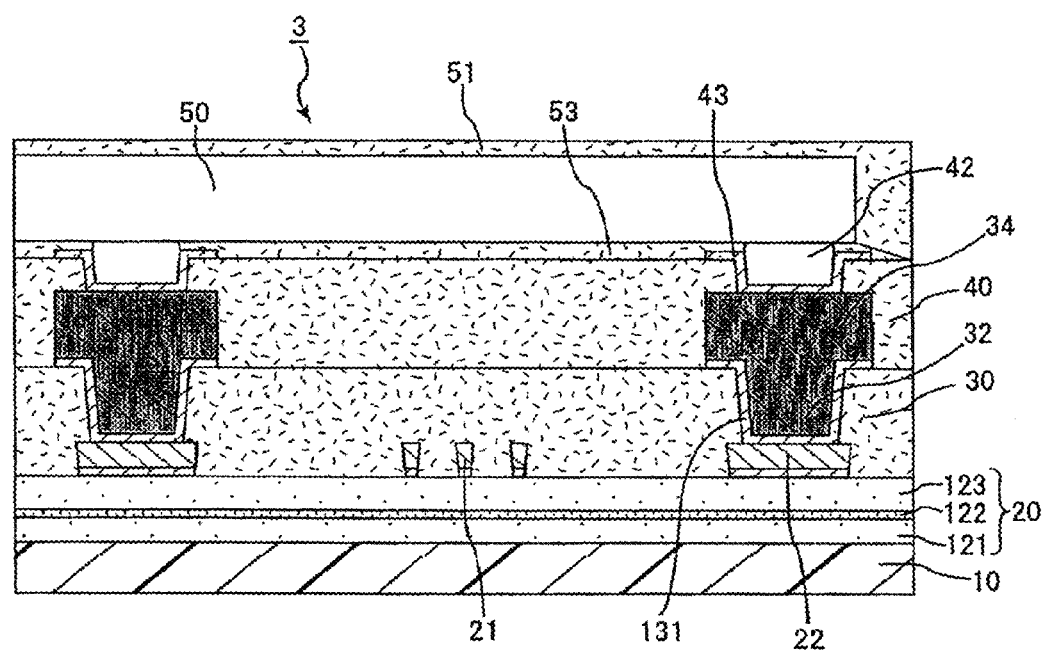
FIG. 20 schematically illustrates a perspective cross-sectional view partially showing an interposer according to yet another embodiment of the present invention.

FIG. 20 is a schematic cross-sectional view partially illustrating an interposer according to yet another embodiment of the present invention. The first wiring in each embodiment described so far was formed by a damascene method. However, the forming method is not limited to such. For example, in interposer 3 shown in FIG. 20, by forming a metal layer on first insulation layer 20 by sputtering or the like, then patterning the metal layer by etching, first wiring 21 or the like may be formed. In such a case, on the surface of first insulation layer 20, first wiring 21 and various lands (22, 23) are formed.

Also, the number of electronic components loaded on an interposer according to an embodiment of the present invention is not limited to a specific number, as long as it is two or more. Electronic components are not limited to specific varieties, functions, or relationships in which electronic components are connected to each other. For example, to the second wiring connected to the first electronic component, the second electronic component may be connected through the first wiring pulled from the side of the second electronic component as shown in the third embodiment, and the third electronic component may be connected only through the pads under the third electronic component as shown in the first embodiment. In addition, those electronic components are not limited to a specific loading form. Namely, multiple semiconductor elements may be mounted in such a way that they are laminated. In such a case, for example, penetrating electrodes formed in each electronic component are connected to each other through solder bumps.

Also, multiple layers of the first insulation layer and/or second insulation layer may be formed, and the first wiring and/or second wiring may be made multilayer wiring.

The material to structure first lands, second lands and first wiring as well as the material to structure first via conductors, second via conductors, first pads, second pads and second wiring is not limited specifically as long as such material has conductivity. Materials other than copper, nickel, gold and silver are listed.

As varieties of material for the second insulation layer, thermosetting resins such as epoxy resin, phenolic resin, polyimide resin, polyether resin, bismaleimide resin, polyolefin-type resin, polyphenylene ether resin, polyphenylene resin and fluoride resin are listed. Also, a photosensitive resin, for example, acrylic resin or the like, is listed.

As for a resin with a photosensitive group added to part of a thermosetting resin, a resin in which the thermosetting group of the above thermosetting resin is reacted with methacryl acid or acrylic acid or the like is listed. Also, as for thermoplastic resins, for example, phenoxy resin, polyethersulfone (PES), polysulfone (PSF), polyphenylene sulfone (PPS), polyphenylene sulfide (PPES), polyphenylene ether (PPE) and polyetherimide (PI) are listed.

Also, as a specific combination of resin compounds to be used for the second insulation layer, for example, phenolic resin/polyether sulfone, polyimide resin/polysulfone, epoxy resin/polyethersulfone, epoxy resin/phenoxy resin, acrylic resin/phenoxy resin, epoxy resin with partially acrylized epoxy group/polyethersulfone are listed. The second insulation layer made of such resin may be multilayered. In addition, the second insulation layer may be formed with inorganic material such as $SiO_2$. In such a case, the thermal expansion coefficient of the interposer may be reduced.

The relationship between the diameter of the first lands and the diameter of the first via conductors, and the relationship between the diameter of the second lands and the diameter of the second via conductors are not limited specifically as long as they are in such a range as to secure continuity between each land and via. They may be the same diameter.

Also, the kind of resist formed on the first insulation layer and the method to expose it to light and develop it are not limited specifically as long as they are the kind of resist and method to expose it to light and develop it that are used in a process to manufacture semiconductors.

As for a method to form a seed layer on the first insulation layer and the second insulation layer, other than sputtering, a so-called PVD (Physical Vapor Deposition) may be used. Specifically, a method such as vacuum vapor deposition, ion plating or electron beam vapor deposition may be used. Also, as for a method to form a seed layer on the surface of the second insulation layer, a conventionally known process to form a conductive circuit by a semi-additive method may be used.

Forming the second insulation layer is not limited to a specific method, but a method to apply uncured resin using a spin coater, curtain coater or the like or a method to form a resin layer by thermo-pressing a resin film may be used. In addition, a method to cure the resin is not limited to thermosetting.

Also, a method to form openings in the second insulation layer is not limited to a process in which it is exposed to light and developed, but a method of opening by a laser process may be used. In such a case, a method to use excimer laser, UV-YAG laser, carbon dioxide gas laser or the like may be listed.

Wiring on an interposer to be used for loading multiple electronic components may be classified roughly into two types: one is the wiring for wiring distributions beneath electronic components, which is formed in a region requiring fine wiring due to the smallness of the area compared with the number of wiring lines; and the other is the wiring between electronic components, which has a rather long wiring distance and is formed in a region having relatively enough space compared with the number of wiring lines and thus fine wiring is not particularly required.

By arranging the wiring distributions beneath electronic components with fine wiring, and by forming the long wiring between electronic components with wiring having a low wiring resistance, numerous wiring distributions in an interposer may be finely arranged and it is possible to provide an interposer suitable for large-volume signal transmission and high-speed signal transmission.

An interposer according to one embodiment of the present invention includes: a support substrate; a first insulation layer made of inorganic material and formed on the support substrate; a first land formed in or on the first insulation layer; a second land formed in or on the first insulation layer; a first wiring formed in or on the first insulation layer and electrically connecting the first land and the second land; a second insulation layer formed on the first insulation layer, the first land, the second land and the first wiring, and having a first opening portion for a first via conductor and a second opening portion for a second via conductor; a first pad formed on the second insulation layer to load a first electronic component; a second pad formed on the second insulation layer to load a second electronic component; a second wiring formed on the second insulation layer; a first via conductor formed in the first opening portion and electrically connecting the first land and the first pad; and a second via conductor formed in the second opening portion and electrically connecting the second land and the second wiring. The first pad and the second pad are electrically connected through the first wiring and the second wiring, and the second wiring has a longer wiring length and a greater thickness than the first wiring.

An interposer according to another embodiment of the present invention has: a support substrate; a first insulation layer made of inorganic material and formed on the support substrate; a first land formed in or on the first insulation layer; a second land formed in or on the first insulation layer; a first wiring formed in or on the first insulation layer and electrically connecting the first land and the second land; a second insulation layer formed on the first insulation layer, the first land, the second land and the first wiring, and having a first opening portion for a first via conductor and a second opening portion for a second via conductor; a first pad formed on the second insulation layer to load a first electronic component; a second pad formed on the second insulation layer to load a second electronic component; a second wiring formed on the second insulation layer; a first via conductor formed in the first opening portion and electrically connecting the first land and the first pad; and a second via conductor formed in the second opening portion and electrically connecting the second land and the second wiring. The first pad and the second pad are electrically connected through the first wiring and the second wiring, and the second wiring has a lower wiring resistance per unit length than the first wiring.

On the first insulation layer made of inorganic material, the first lands, second lands and first wiring are formed and the first wiring electrically connects the first lands and second lands. Also, on the second insulation layer positioned on the first insulation layer, the second wiring is formed. The second wiring has a longer wiring length and a greater thickness than the first wiring. In other words, the second wiring has a lower wiring resistance per unit length than the first wiring. Namely, wiring between the first electronic component and the second electronic component is made up of first wiring for fine distributions under the first electronic component, and of second wiring having a longer wiring length and greater thickness than the first wiring. In the wiring between the first electronic component and the second electronic component, for example, only fine distributions necessary among connection terminals of the first electronic component are arranged with first wiring, and a substantial portion of the wiring between the first electronic component and the second electronic component is formed with second wiring, which has a low wiring resistance per unit length. Accordingly, the wiring resistance may be reduced effectively, and an interposer suitable for large-volume signal transmission may be obtained.

Furthermore, since fine distributions are possible with the first wiring of the first insulation layer, it is not required to fan out the wiring gradually by increasing the number of layers. Thus, with a smaller number of layers, it is possible to deal with finer features of the terminals of electronic components.

Measuring wiring resistance is not limited to a specific method. For example, wiring resistance may be measured by connecting resistance-measurement equipment to a specific wiring by using a probe. As for measurement equipment, impedance analyzer (product number: 4194A) made by Agilent Technologies Inc. may be listed.

Also, as the wiring thickness increases, attenuation of the signal amplitude in a high frequency band decreases in the wiring. For example, regarding 4-mm-long wiring, a signal in a predetermined band is input in one end of the wiring and output from the other end, and the maximum frequency is measured when the ratio of amplitude of the input signal to amplitude of the output signal becomes −3 dB. The results are: 0.8 GHz when the wiring thickness is 1 μm and L/S=3/3 μm; 2.2 GHz when the wiring thickness is 1 μm and L/S=515 μm; 12.5 GHz when the wiring thickness is 3 μm and L/S=3/3 μm; and 18.0 GHz when the wiring thickness is 3 μm and L/S=5/5 μm. If those frequencies are the maximum operation frequencies of a device when the device operates normally, the thicker the wiring, the less attenuation of signal amplitude, and thus such wiring is preferably used in a high frequency band.

In the interposer according to the foregoing embodiments, the second wiring corresponds to wiring with greater thickness. The second wiring also corresponds to wiring with greater L/S, since the resistance per unit length is small. Accordingly, in an interposer having a second wiring, attenuation of signal amplitude is less, thus it is preferably used in a high frequency band.

A percentage of the length of the second wiring to the entire length of the wiring connecting the first electronic component and the second electronic component may be in the range of 60-90%. If the percentage of the length of the second wiring is set as above, the percentage of the length of the second wiring having a low wiring resistance increases. Accordingly, it is easier to reduce the wiring resistance between the two electronic components.

A ratio of the thickness of the second wiring to the thickness of the first wiring may be larger than one (1) but no larger than 15. Within such a range, warping of the interposer is suppressed and, for example, if an organic insulation layer expands/shrinks due to its thermal history, adhesion to the organic insulation layer may be easily maintained. Namely, if the ratio of the thickness of the second wiring to the thickness of the first wiring is less than one (1), the rigidity of the interposer is not sufficiently ensured and thus warping may occur in the interposer due to the difference in thermal expansion coefficients between a semiconductor element and the interposer. On the other hand, if the ratio of the thickness of the second wiring to the thickness of the first wiring exceeds 15, the aspect ratio of the second wiring increases when assuming that the wiring width is the same. For example, if an organic insulation layer expands/shrinks due to its thermal history, the second wiring would easily follow the expansion/shrinkage of the organic insulation layer, causing lowered adhesiveness of the second wiring to the organic insulation layer.

The second insulation layer may be made of organic material. By using organic material to make the second insulation layer, the interposer's tolerance to shock is enhanced and cracks or the like may be suppressed.

The second lands may be arranged outside the first-pad forming region. "The first-pad forming region" indicates a predetermined region which includes all the first pads with the smallest possible plane area. The region is also referred to as "the reflected region of the first electronic component."

Here, the first-pad forming region (the reflected region of the first electronic component) is the region directly under the first electronic component, and the area to arrange wiring is limited. Thus, a fine wiring distribution is required in that region. In contrast, the region outside the first-pad forming region (the reflected region of the first electronic component) is the region between electronic components, and thus a fine wiring distribution is not particularly required. If the second lands are arranged in such a position, from the first lands electrically connected to the connection terminals of the first electronic component (and the first pads connected to the connection terminals), using fine first wiring, a wiring distribution is arranged among the first lands, and the first wiring is pulled outside the first-land forming region (the reflected region of the first electronic component) so as to be connected to the second lands in the region having relatively enough space. Namely, wiring may be pulled from the region where fine wiring is required to a region where fine wiring is not particularly required.

The first wiring may be formed by a damascene method and the second wiring may be formed by a semi-additive method. The first wiring, formed by a damascene method, becomes fine wiring. The second wiring, formed by a semi-additive method, becomes wiring that has a greater thickness and lower resistance per unit length than the first wiring formed by a damascene method.

The L/S of the first wiring may be smaller than the L/S of the second wiring. If the L/S of the first wiring is made smaller than the L/S of the second wiring, a fine wiring distribution in or on the first insulation layer may be arranged easily.

The pitch of the second via conductors may be made larger than the pitch of the first via conductors when multiple first and second via conductors are formed in an interposer. The first via conductors are connected to the first pads for loading electronic components, and by making their pitch small, an electronic component with a small pitch among connection terminals may be loaded. Also, outside the first-pad forming region (the reflected region of the first electronic component), the first wiring of the present invention is fanned out. Namely, since the pitch of the second via conductors is relatively large compared with the pitch of the first via conductors, the second wiring with a relatively large L/S may be easily formed.

The surface having the first insulation layer, the first lands, the second lands and the first wiring may be made flat. If the surface is made flat, a second insulation layer, first via conductors, second via conductors and second wiring may be accurately formed on the surface and the interposer may be made with highly flat characteristics.

The diameter of the first lands may be larger than the diameter of the first via conductors, and the diameter of the second lands may be larger than the diameter of the second via conductors. If the relationship of the diameters of lands and via conductors is set as above, the area where lands and via conductors make contact is secured, and their continuity improves, leading to enhanced connection reliability in both. Also, when forming the first opening portions and second opening portions, since extra space for each opening portion is ensured in each land, strict alignment control is not required and simplified manufacturing steps are achieved.

The diameter of the first lands may be the same as the diameter of the first via conductors, and the diameter of the second lands may be the same as the diameter of the second via conductors. If the relationship of the diameters of lands and via conductors is set as above, since in each land extra space is not formed for each opening portion, more space between lands may be secured than in a conventional case and wiring may be made further highly integrated.

The support substrate may be made of silicon. Since the flatness of a support substrate made of silicon is extremely high, fine wiring may be formed on its surface. Furthermore, the rigidity of the interposer is improved by employing silicon as a support substrate. Accordingly, warping caused by different thermal expansion coefficients between multiple loaded electronic components and the interposer may be effectively suppressed.

A protective film with openings may be further formed on the first pads and second pads respectively. With such a protective film, the wiring layers in the inner section are protected, and damage to them may be suppressed.

One layer each of the first insulation layer and the second insulation layer may be formed. If one layer each of the first insulation layer and the second insulation layer is formed, the thickness of the entire interposer is reduced, and the height of the substrate when electronic components are mounted may be made low. Also, considering the viewpoint that the wiring length between electronic components is made substantially short, the wiring resistance may be reduced.

Multiple layers of the first insulation layer may be formed. By forming multiple layers of the first insulation layer made of inorganic material, the thermal expansion coefficient of the interposer may be reduced.

Between the first insulation layer and the second insulation layer, an inorganic film may be formed. If an inorganic film is formed between the first insulation layer and the second insulation layer, the adhesiveness between the first insulation layer and the second insulation layer may be enhanced.

A method of manufacturing an interposer includes: a step to form a first insulation layer made of inorganic material on a support substrate; a step to form a first wiring on the first insulation layer; a step to form a second insulation layer on the first insulation layer and the first wiring; and on the second insulation layer, a step to form a second wiring with a longer wiring length and a greater thickness than the first wiring.

By such steps, an interposer having first wiring for fine wiring distributions and second wiring with a longer wiring length and a greater thickness than the first wiring (wiring resistance per unit length is low) may be manufactured.

In such an interposer, when arranging wiring between the first electronic component and the second electronic component, for example, fine wiring distributions definitely required among the connection terminals of the first electronic component are conducted with the first wiring, and a substantial portion of wiring between the first electronic component and the second electronic component is structured with the second wiring. Accordingly, wiring resistance may be reduced effectively. Also, an interposer suitable for large-volume signal transmission may be obtained.

In the method of manufacturing an interposer, the second wiring may be formed thicker than the first wiring. With such a structure, an interposer may be manufactured in which a substantial portion of the connection between electronic components may be arranged with the second wiring, which has lower wiring resistance per unit length.

In the method of manufacturing an interposer, the second wiring may be formed by a semi-additive method. By using a semi-additive method, the second wiring, which has a longer wiring length and greater thickness than the first wiring (the wiring resistance per unit length is low), may be formed simply at a low cost.

In the method of manufacturing an interposer, the first wiring may be formed by a damascene method. By using a damascene method, the first wiring for arranging a fine wiring distribution may be formed accurately. Furthermore, highly flat wiring may be formed.

In the method of manufacturing an interposer, an inorganic film may be formed on the surface of the first insulation layer. By forming an inorganic film, when a second insulation layer is formed on the inorganic film, the adhesiveness between the first insulation layer and the second insulation layer may be enhanced.

Obviously, numerous modifications and variations of the present invention are possible in light of the above teachings. It is therefore to be understood that within the scope of the appended claims, the invention may be practiced otherwise than as specifically described herein.

What is claimed is:

1. An interposer comprising:
a support substrate;
a first insulation layer comprising an inorganic material and formed over the support substrate, the first insulation layer having a first land, a second land and a first wiring electrically connecting the first land and the second land; and
a second insulation layer formed over the first insulation layer and having a first pad positioned to load a first electronic component and a second pad positioned to load a second electronic component, the second insulation layer further having a second wiring electrically connected to the second pad, a first via conductor electrically connecting the first land and the first pad, and a second via conductor electrically connecting the second land and the second wiring,
wherein the first wiring and second wiring electrically connect the first pad and the second pad, and the second wiring has a lower wiring resistance per unit length than the first wiring.

2. The interposer according to claim 1, wherein the second wiring has a longer wiring length and a greater thickness than the first wiring.

3. The interposer according to claim 2, wherein the second wiring has a length of which a percentage to a total wiring length connecting the first electronic component and the second electronic component is in a range of 60-90%.

4. The interposer according to claim 2, wherein the second wiring has a thickness of which a ratio to a thickness of the first wiring is larger than 1 but not larger than 15.

5. The interposer according to claim 1, wherein the second insulation layer comprises an organic material.

6. The interposer according to claim 1, wherein the second land is formed outside a first-pad forming region.

7. The interposer according to claim 1, wherein the first wiring is formed by a damascene method and the second wiring is formed by a semi-additive method.

8. The interposer according to claim 1, wherein the first wiring has L/S which is smaller than L/S of the second wiring.

9. The interposer according to claim 1, wherein the second insulation layer has the first via conductor and second via conductor in a plurality, and the plurality of second via conductors has a pitch which is larger than a pitch of the plurality of first via conductors.

10. The interposer according to claim 1, wherein the first insulation layer has a surface which includes the first land, the second land and the first wiring, and the surface is formed flat.

11. The interposer according to claim 1, wherein the first land has a diameter which is larger than a diameter of the first via conductor, and the second land has a diameter which is larger than a diameter of the second via conductor.

12. The interposer according to claim 1, wherein the first land has a diameter which is substantially same as a diameter of the first via conductor, and the second land has a diameter which is substantially same as a diameter of the second via conductor.

13. The interposer according to claim 1, wherein the support substrate comprises silicon.

14. The interposer according to claim 1, further comprising a protective film over the second insulation layer and having openings on the first pad and the second pad, respectively.

15. The interposer according to claim 1, wherein the first insulation layer is formed on the support substrate, and the second insulation layer is formed on the first substrate.

16. The interposer according to claim 1, wherein the first insulation layer is formed in a plurality.

17. The interposer according to claim 1, further comprising an inorganic film formed between the first insulation layer and the second insulation layer.

* * * * *